(12) United States Patent
Lee et al.

(10) Patent No.: US 11,139,320 B2
(45) Date of Patent: Oct. 5, 2021

(54) DISPLAY DEVICE AND METHOD OF MANUFACTURING SAME

(71) Applicant: SAMSUNG DISPLAY CO., LTD., Yongin-si (KR)

(72) Inventors: Jeongho Lee, Yongin-si (KR); Yanghee Kim, Yongin-si (KR); Wonho Kim, Yongin-si (KR); Soyeon Park, Yongin-si (KR); Keunsoo Lee, Yongin-si (KR); Hyungchul Lim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/876,483

(22) Filed: May 18, 2020

(65) Prior Publication Data

US 2020/0279871 A1 Sep. 3, 2020

Related U.S. Application Data

(63) Continuation of application No. 16/056,899, filed on Aug. 7, 2018, now Pat. No. 10,672,802.

(30) Foreign Application Priority Data

Nov. 30, 2017 (KR) ........................ 10-2017-0163690

(51) Int. Cl.
*H01L 27/14* (2006.01)
*H01L 27/12* (2006.01)
(Continued)

(52) U.S. Cl.
CPC ........ *H01L 27/124* (2013.01); *H01L 27/1218* (2013.01); *H01L 27/1262* (2013.01);
(Continued)

(58) Field of Classification Search
CPC .............. H01L 27/124; H01L 27/1218; H01L 27/1262; H01L 27/3276; H01L 51/0097
(Continued)

(56) References Cited

U.S. PATENT DOCUMENTS 7,524,226 B2   4/2009 Winters
7,846,619 B2   12/2010 Han
(Continued)

FOREIGN PATENT DOCUMENTS

EP   3236309 A1   10/2017
EP   3442024 A1    2/2019
(Continued)

OTHER PUBLICATIONS

Extended European Search Report for Application No. 18195196.3 dated Apr. 26, 2019, citing the above reference(s).

*Primary Examiner* — Tan N Tran
(74) *Attorney, Agent, or Firm* — Cantor Colburn LLP

(57) ABSTRACT

A display device includes a substrate including a first area, a second area, and a bent area therebetween, an inner wiring disposed in the first area, an outer wiring disposed in the second area, an inter-insulating layer which covers the inner wiring and the outer wiring and in which an opening corresponding to the bent area is defined, a first organic insulating layer, where a portion thereof is located in the opening, a connection wiring disposed on the first organic insulating layer and connecting the inner wiring to the outer wiring, a conductive layer disposed between the inter-insulating layer and the first organic insulating layer and electrically connected to one of the inner wiring and the outer wiring, and an inorganic protective layer which covers the conductive layer and in which an opening corresponding to the bent area is defined.

15 Claims, 21 Drawing Sheets

(51) Int. Cl.
*H01L 51/00* (2006.01)
*H01L 27/32* (2006.01)

(52) U.S. Cl.
CPC ...... *H01L 27/3276* (2013.01); *H01L 51/0097* (2013.01); *H01L 27/3258* (2013.01)

(58) Field of Classification Search
USPC .................................................. 257/59, 72
See application file for complete search history.

(56) References Cited

U.S. PATENT DOCUMENTS

| | | |
|---|---|---|
| 2016/0079336 A1 | 3/2016 | Youn et al. |
| 2017/0170206 A1 | 6/2017 | Lee et al. |
| 2017/0277288 A1* | 9/2017 | Choi ..................... H01L 27/323 |
| 2019/0041915 A1 | 2/2019 | Park et al. |
| 2020/0388668 A1* | 12/2020 | Okabe ................. H01L 51/5218 |

FOREIGN PATENT DOCUMENTS

| | | |
|---|---|---|
| KR | 1020080004209 A | 1/2008 |
| KR | 100809331 B1 | 2/2008 |
| KR | 1020090077909 A | 7/2009 |
| KR | 1020140099164 A | 8/2014 |
| KR | 1020140129647 A | 11/2014 |
| KR | 1020170071047 A | 6/2017 |

\* cited by examiner

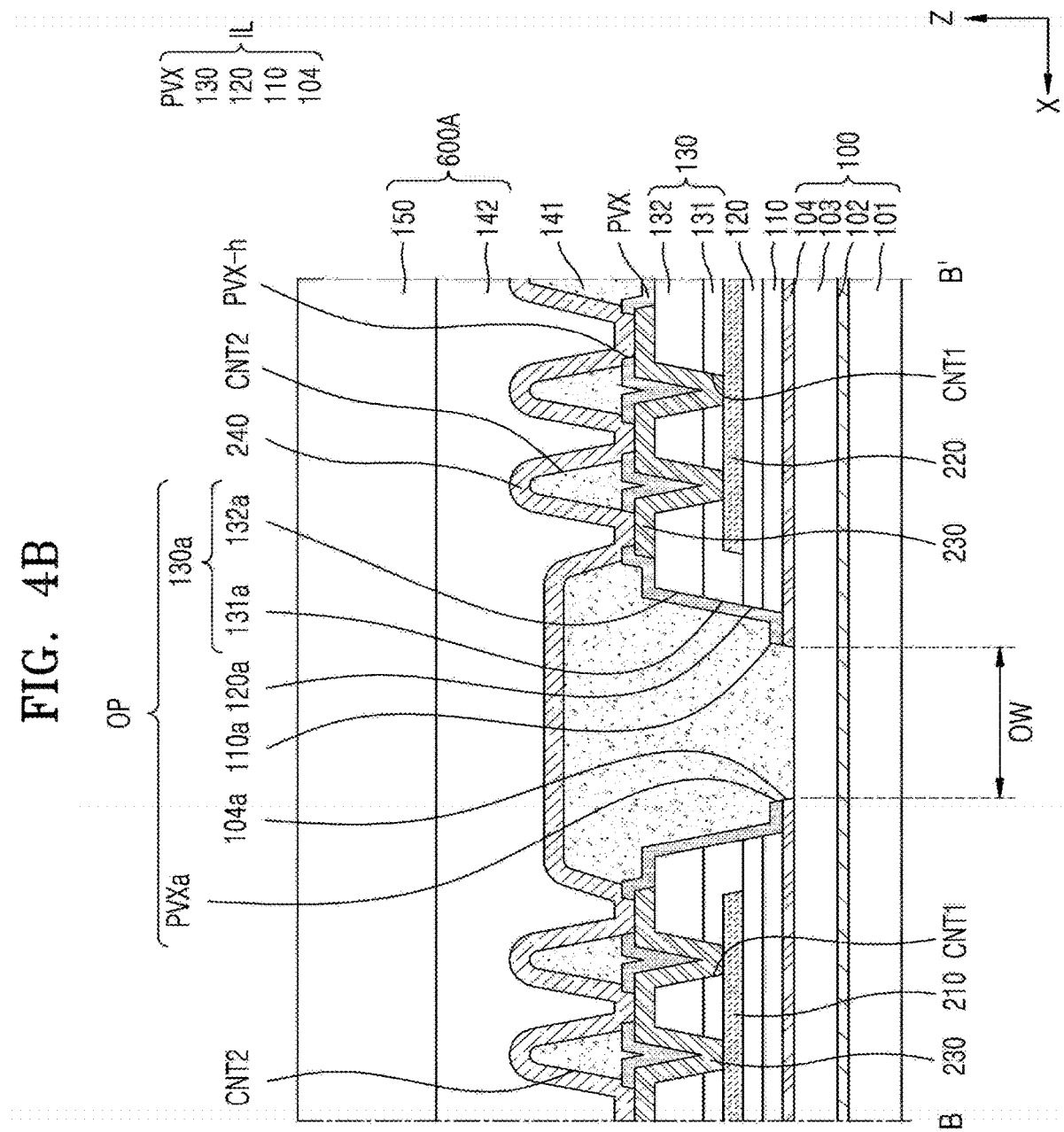

DISPLAY DEVICE AND METHOD OF MANUFACTURING SAME

This application is a continuation of U.S. patent application Ser. No. 16/056,899, filed on Aug. 7, 2018, which claims priority to Korean Patent Application No. 10-2017-0163690, filed on Nov. 30, 2017, and all the benefits accruing therefrom under 35 U.S.C. § 119, the content of which in its entirety is herein incorporated by reference.

BACKGROUND

1. Field

One or more exemplary embodiments relate to a display device and a method of manufacturing the same.

2. Description of the Related Art

Recently, usages of a display device have become more diversified. Also, as the display device becomes thinner and more lightweight, a range of the uses of the display device has been gradually extended. As the display device is utilized in various ways, a design of the display device, such as an ability to bend at least a portion of the display device, has been diversified.

SUMMARY

To bend a display device, a structure and a process for preventing occurrence of a crack, etc., around a bent area are desired, and thus the structure may be complicated and a number of processes may further increase compared with a display device not including a bendable area.

One or more exemplary embodiments include a display device desiring a minimum process and including a bent area having a structure corresponding thereto. However, this objective is provided as an example and the scope of the invention is not limited thereto.

Additional exemplary embodiments will be set forth in part in the description which follows and, in part, will be apparent from the description, or may be learned by practice of the presented embodiments.

According to one or more exemplary embodiments, a display device includes a substrate including a first area, a second area, and a bent area between the first and second areas, an inner wiring disposed in the first area, an outer wiring disposed in the second area, an inter-insulating layer which covers the inner wiring and the outer wiring and in which an opening corresponding to the bent area is defined, a first organic insulating layer, a portion of the first organic insulating layer being located in the opening, a connection wiring disposed on the first organic insulating layer and connecting the inner wiring and the outer wiring, a conductive layer disposed between the inter-insulating layer and the first organic insulating layer and electrically connected to one of the inner wiring and the outer wiring, and an inorganic protective layer which covers the conductive layer and in which an opening corresponding to the bent area is defined.

In an exemplary embodiment, an upper surface of an end portion of the inter-insulating layer which is adjacent to the opening of the inter-insulating layer may be covered by the inorganic protective layer.

In an exemplary embodiment, the display device may further include a lower insulating layer, the lower insulating layer being disposed below the inner wiring such that the inner wiring is located between the lower insulating layer and the inter-insulating layer, and the lower insulating layer in which an opening corresponding to the bent area is defined.

In an exemplary embodiment, the lower insulating layer and the inter-insulating layer may form a step difference in a region adjacent to the bent area.

In an exemplary embodiment, an end portion of the inorganic protective layer may cover a lateral surface of the inter-insulating layer and an upper surface of the lower insulating layer in a region adjacent to the bent area.

In an exemplary embodiment, an end portion of the inorganic protective layer may be covered by the first organic insulating layer in a region adjacent to the bent area.

In an exemplary embodiment, the first organic insulating layer may directly contact the substrate in the bent area.

In an exemplary embodiment, the substrate may include a base layer and an inorganic barrier layer which is disposed on the base layer and in which an opening corresponding to the bent area is defined, and the first organic insulating layer directly contacting the base layer.

In an exemplary embodiment, the first area may include a display area including a plurality of pixels, and each pixel may include a thin film transistor, a pixel electrode electrically connected to the thin film transistor, an opposite electrode facing the pixel electrode, and an intermediate layer between the pixel electrode and the opposite electrode, the intermediate layer including an emission layer.

In an exemplary embodiment, the display device may further include a second organic insulating layer disposed between the connection wiring and the pixel electrode.

According to one or more exemplary embodiments, a display device includes a display area including a thin film transistor on a substrate, and a display element including a pixel electrode, an intermediate layer, and an opposite electrode sequentially stacked, a non-display area adjacent to the display area and including a bent area, an inner wiring and an outer wiring mutually spaced apart from each other with the bent area therebetween, an inter-insulating layer which is disposed on the inner wiring and the outer wiring and in which an opening corresponding to the bent area is defined, a connection wiring electrically connecting the inner wiring to the outer wiring and passing across the bent area, and a first organic insulating layer disposed in the display area and the non-display area, a portion of the first organic insulating layer being located in the opening of the inter-insulating layer, where the connection wiring is disposed below the pixel electrode with an insulating layer therebetween.

In an exemplary embodiment, the display device may further include a conductive layer disposed between the inner wiring and the connection wiring, and between the outer wiring and the connection wiring.

In an exemplary embodiment, the display device may further include an inorganic protective layer which is disposed on the conductive layer and in which an opening corresponding to the bent area is defined.

In an exemplary embodiment, an end portion of the inorganic protective layer may cover the inter-insulating layer and may be covered by the first organic insulating layer in a region adjacent to the bent area.

In an exemplary embodiment, the display device may further include a lower insulating layer which is disposed below the inner wiring such that the inner wiring is located between the lower insulating layer and the inter-insulating layer and in which an opening corresponding to the bent area is defined.

In an exemplary embodiment, the substrate may include a base layer and an inorganic barrier layer on the base layer, the lower insulating layer being the inorganic barrier layer.

In an exemplary embodiment, the first organic insulating layer may directly contact the base layer of the substrate.

In an exemplary embodiment, the inter-insulating layer and the lower insulating layer may form a step difference.

In an exemplary embodiment, a width of the opening of the lower insulating layer may be greater than a width of the bent area.

In an exemplary embodiment, a width of the opening of the inter-insulating layer may be greater than a width of the opening of the lower insulating layer.

According to one or more exemplary embodiments, a method of manufacturing a display device includes forming a thin film transistor and a storage capacitor in a display area, forming an inner wiring and an outer wiring in a non-display area, the inner wiring and the outer wiring being spaced apart from each other around a bent area, forming an inter-insulating layer which is disposed on the inner wiring and the outer wiring, and in which an opening corresponding to the bent area is defined, forming a connection metal connected to the thin film transistor, forming a conductive layer connected to the inner wiring and the outer wiring, forming an inorganic protective layer covering the connection metal and the conductive layer, and etching the inorganic protective layer to define a hole exposing the connection metal, a first contact hole exposing the conductive layer, and an opening corresponding to the bent area, where the etching of the inorganic protective layer includes etching at least one lower inorganic insulating layer provided below the inorganic protective layer such that an opening corresponding to the bent area is defined in the at least one lower inorganic insulating layer.

In an exemplary embodiment, the etching of the inorganic protective layer and the etching of the at least one lower inorganic insulating layer may be performed during a same mask process using a halftone mask.

In an exemplary embodiment, an end portion of the inter-insulating layer and an end portion of the at least one lower inorganic insulating layer may form a step difference in a region adjacent to the bent area.

In an exemplary embodiment, an end portion of the inorganic protective layer may be located on an end portion of the inter-insulating layer in a region adjacent to the bent area.

In an exemplary embodiment, an end portion of the inorganic protective layer may be located on an end portion of the at least one lower inorganic insulating layer in a region adjacent to the bent area.

In an exemplary embodiment, the method may further include forming a first organic insulating layer on the inorganic protective layer such that a portion of the first organic insulating layer is located in the opening of the inter-insulating layer and the opening of the at least one lower inorganic insulating layer.

In an exemplary embodiment, the first organic insulating layer may extend to the display area such that the first organic insulating layer is disposed on the connection metal.

In an exemplary embodiment, a second contact hole exposing the conductive layer may be defined in the first organic insulating layer, and the method may further include forming a connection wiring connected to the conductive layer through the second contact hole.

In an exemplary embodiment, the method may further include forming a second organic insulating layer on the connection wiring, and forming a pixel electrode on the second organic insulating layer.

BRIEF DESCRIPTION OF THE DRAWINGS

These and/or other exemplary embodiments will become apparent and more readily appreciated from the following description of the exemplary embodiments, taken in conjunction with the accompanying drawings, in which:

FIG. 4B is a view of a modification of FIG. 4A;

DETAILED DESCRIPTION

Figure 1:
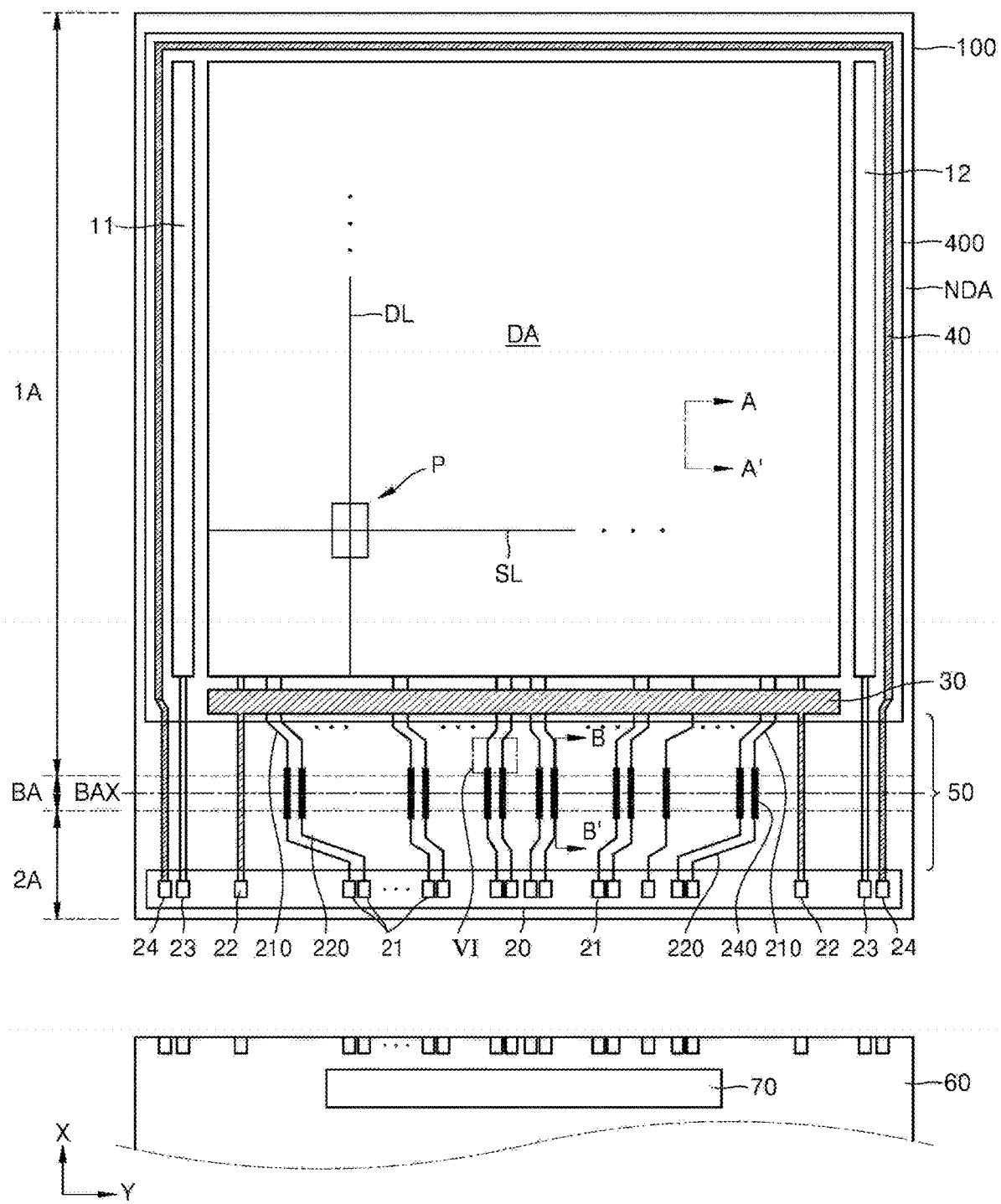
FIG. 1 is a plan view of a display device according to an exemplary embodiment.

As the invention allows for various changes and numerous embodiments, exemplary embodiments will be illustrated in the drawings and described in detail in the written description. Effects and characteristics of exemplary embodiments, and a method of accomplishing them will be apparent by referring to content described below in detail together with the drawings. However, the exemplary embodiments are not limited to exemplary embodiments below and may be implemented in various forms.

Hereinafter, embodiments of the invention are described in detail with reference to the accompanying drawings, and when descriptions are made with reference to the drawings, like or corresponding elements are given like reference numerals and repeated descriptions thereof are omitted.

It will be understood that although the terms "first", "second", etc., may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises/includes" and/or "comprising/including" used herein specify the presence of stated features or components, but do not preclude the presence or addition of one or more other features or components.

It will be understood that when a layer, region, or component is referred to as being "disposed on" another layer, region, or component, it can be directly or indirectly disposed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

A display device is an apparatus displaying an image and may be a liquid crystal display, an electrophoretic display, an organic light-emitting display, an inorganic light-emitting display, a field emission display, a surface-conduction electron-emitter display, a plasma display, a cathode ray display, etc.

Exemplary embodiments of the invention may prevent a damage of a bent area through a relatively simple structure, and improve a manufacturing efficiency by reducing a mask process. However, the scope of the invention is not limited by this effect, and this effect is provided as an example and effects corresponding to embodiments are described in detail through contents below.

Hereinafter, though an organic light-emitting display as a display device according to an exemplary embodiment is described as an example, the display device is not limited thereto and various types of display devices may be used.

Figure 2:
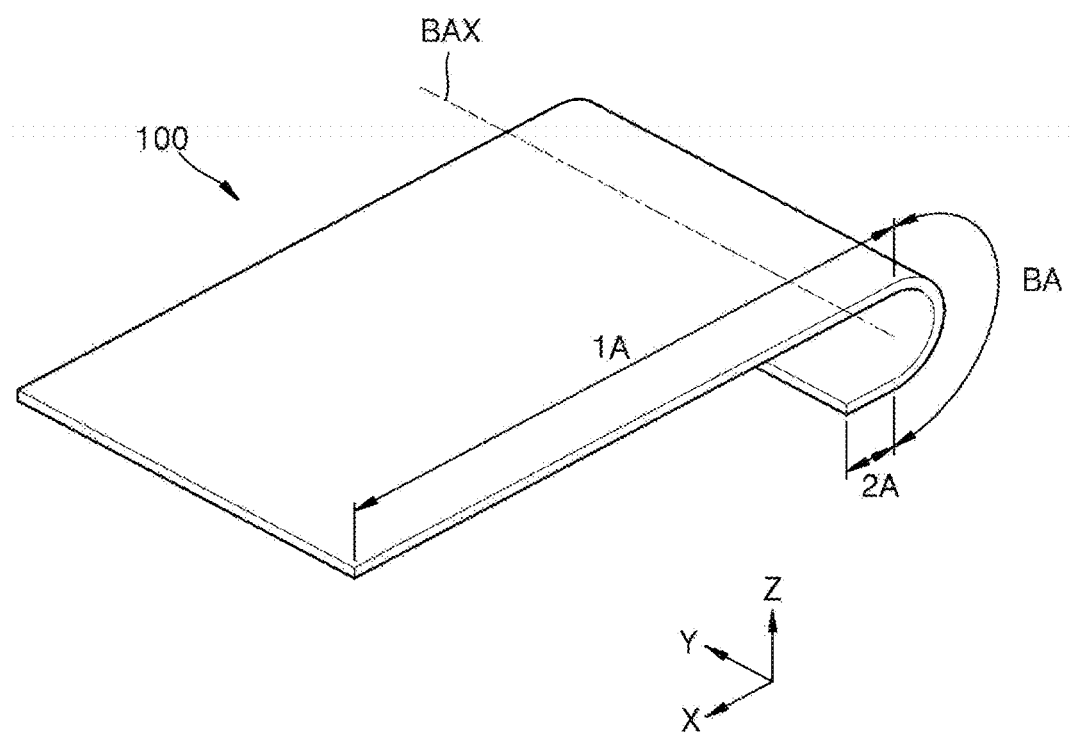
FIG. 2 is a perspective view of a portion of a display device according to an exemplary embodiment.

FIG. 1 is a plan view of a display device according to an exemplary embodiment, and FIG. 2 is a perspective view of a portion of a display device according to an exemplary embodiment.

Referring to FIGS. 1 and 2, the substrate 100 may have a bent area BA extending in a first direction (e.g., Y direction). The bent area BA may be located between a first area 1A and a second area 2A in a second direction (e.g., X direction) crossing the first direction.

The substrate 100 may be bent around a bending axis BAX extending in the first direction. Although FIG. 2 illustrates that the substrate 100 is bent at the same curvature radius around the bending axis BAX, the invention is not limited thereto. The substrate 100 may be bent around the bending axis BAX and a curvature radius thereof may not be constant.

In an exemplary embodiment, the substrate 100 may include various flexible or bendable materials, for example, may include polymer resins such as polyethersulphone ("PES"), polyacrylate ("PAR"), polyetherimide ("PEI"), polyethylene naphthalate ("PEN"), polyethylene terephthalate ("PET"), polyphenylene sulfide ("PPS"), polyarylate, polyimide ("PI"), polycarbonate ("PC"), or cellulose acetate propionate ("CAP").

The first area 1A may include a display area DA. As illustrated in FIG. 1, the first area 1A may include the display area DA and a portion of a non-display area NDA outside the display area DA. The second area 2A and the bent area BA may include the non-display area NDA. The display area DA of the display device may correspond to a portion of the first area 1A, and the non-display area NDA may correspond to the rest of the first area 1A, the second area 2A, and the bent area BA.

The display area DA may include pixels P and display an image. A pixel P may be connected to signal lines such as a scan line SL extending in the first direction and a data line DL extending in the second direction. Though not shown in FIG. 1, the pixel P may be connected to power lines transferring a current signal such as a driving power line and a common power line. In an exemplary embodiment, the current signal of the driving power line and the common power line may be a direct current ("DC") voltage, for example, but the invention is not limited thereto.

The pixel P may include electronic elements such as a thin film transistor ("TFT") and a storage capacitor electrically connected to the above-described signal lines and power lines, and an organic light-emitting device ("OLED") connected to the above-described electronic elements. The pixel P may emit, for example, red, green, blue, or white light through an OLED. A pixel in the specification may be understood as a pixel emitting light of one of red, green, and blue, or a pixel emitting light of one of red, green, blue, and white as described above. However, the invention is not limited thereto, and the pixel may emit light having various other colors. The display area DA may be covered by an encapsulation layer 400 and thereby protected from external air or moisture. In the case where a display element provided to the pixel P is an OLED, the TFTs may include a driving TFT and a switching TFT, and may further include an additional TFT in addition to the above-described two TFTs depending on the design of the pixel P.

The non-display area NDA may include first and second scan drivers 11 and 12, a terminal unit 20, a driving voltage supply line 30, a common voltage supply line 40, and a wiring unit 50.

The first and second scan drivers 11 and 12 may be disposed in the first area 1A. In an exemplary embodiment, the first and second scan drivers 11 and 12 may be spaced apart from each other with the display area DA therebetween, for example. The first and second scan drivers 11 and 12 may generate a scan signal and transfer the scan signal to each pixel P through a scan line SL. Although FIG. 1 illustrates a case where the two scan drivers are disposed, the invention is not limited thereto. In another exemplary embodiment, one scan driver may be disposed on one side of the display area DA.

The terminal unit 20 may be disposed on one end portion of the non-display area NDA, and may include terminals 21, 22, 23, and 24. The terminal unit 20 may be exposed without being covered by an insulating layer and connected to a flexible film 60 such as a flexible printed circuit board including a driver integrated circuit ("IC") 70. Although FIG. 1 illustrates a chip on film ("COF") type IC in which the driver IC 70 is connected through the flexible film 60, the invention is not limited thereto. In another exemplary embodiment, the driver IC 70 may be a chip on panel ("COP") type IC in which the driver IC 70 is disposed (e.g. directly disposed) on the terminal unit 20 of the substrate 100.

The driving voltage supply line 30 may provide a driving voltage to the pixels P. The driving voltage supply line 30 may be disposed in the non-display area NDA such that the driving voltage supply line 30 is adjacent to one side of the display area DA.

The common voltage supply line 40 may provide a common voltage to the pixels P. The common voltage supply line 40 may be disposed in the non-display area NDA to partially surround the display area DA.

The wiring unit 50 may include inner wirings 210 disposed in the first area 1A, outer wirings 220 disposed in the second area 2A, and connection wirings 240 which are bridge wirings electrically connecting the inner wirings 210 to the outer wirings 220. Each inner wiring 210 may be electrically connected to a signal line of the display area DA, and each outer wiring 220 may be electrically connected to the terminal unit 20 of the non-display area NDA.

The connection wiring 240 may extend from the first area 1A to the second area 2A across the bent area BA. The connection wiring 240 may cross the bending axis BAX described with reference to FIG. 2. Although the connection wiring 240, which is a bridge wiring, extends perpendicularly with respect to the bending axis BAX in FIG. 1, the invention is not limited thereto. The connection wiring 240 may obliquely extend such that the connection wiring 240 has a preset angle with respect to the bending axis BAX, or may extend while having various shapes such as a curved shape and a zigzag shape, not a straight line shape.

Figure 3:
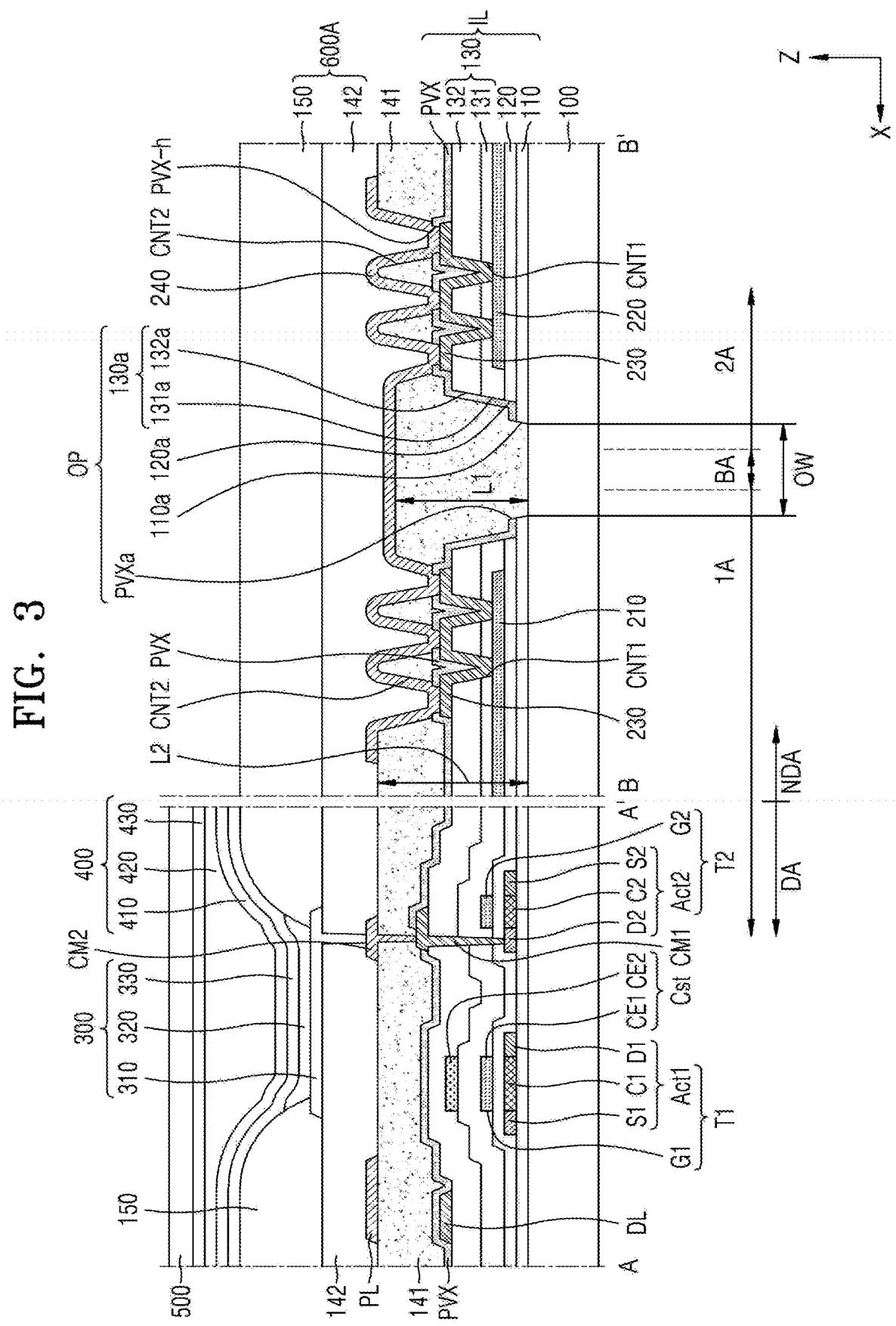
FIG. 3 is a cross-sectional view of a display device according to an exemplary embodiment.
Figure 4A:
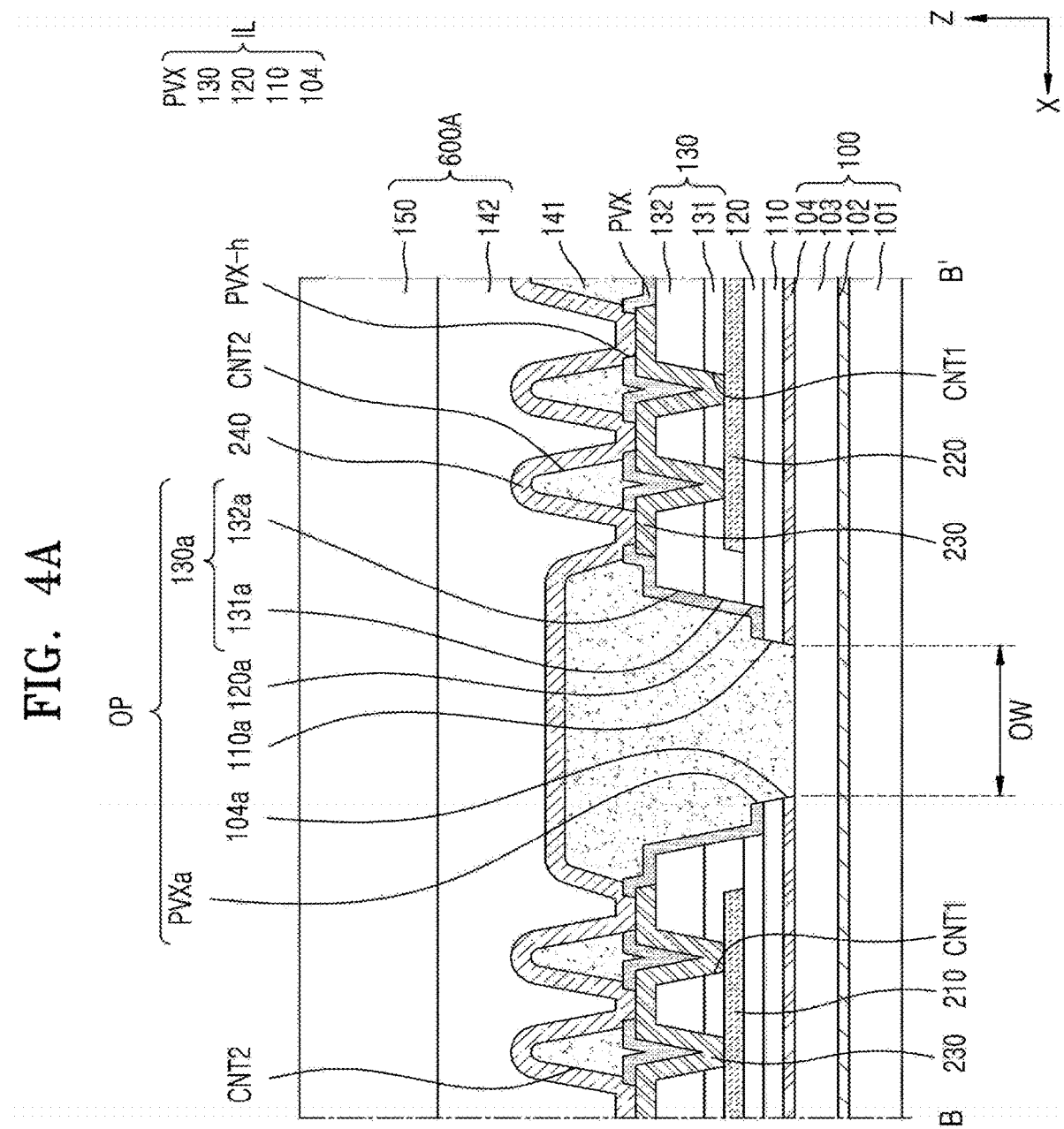
FIG. 4A is an enlarged cross-sectional view of a partial region around a bent area of FIG. 3.

FIG. 3 is a cross-sectional view of a display device according to an exemplary embodiment and corresponds to cross-sections of the display device taken along lines A-A' and B-B' of FIG. 1, FIG. 4A is an enlarged cross-sectional view of a partial region around the bent area BA of FIG. 3, and FIG. 4B is a view of a modification of FIG. 4A.

Referring to the cross-section of FIG. 3 taken along line A-A' of FIG. 1, an OLED 300 as a display element may be disposed in the display area DA. The OLED 300 may be electrically connected to first and second TFTs T1 and T2, and a storage capacitor Cst. The first TFT T1 includes a first semiconductor layer Act1 and a first gate electrode G1, and the second TFT T2 includes a second semiconductor layer Act2 and a second gate electrode G2.

The first semiconductor layer Act1 and the second semiconductor layer Act2 may include amorphous silicon, polycrystalline silicon, an oxide semiconductor, or an organic semiconductor material. The first semiconductor layer Act1 may include a channel region C1, and a source region S1 and a drain region D1 respectively disposed at opposite sides of the channel region C1. The second semiconductor layer Act2 may include a channel region C2, and a source region S2 and a drain region D2 respectively disposed at opposite sides of the channel region C2. The first and second source regions S1 and S2, and the first and second drain regions D1 and D2 respectively of the first and second semiconductor layers Act1 and Act2 may be understood as source electrodes and drain electrodes respectively of the first and second TFTs T1 and T2.

The first gate electrode G1 and the second gate electrode G2 may respectively overlap the channel region C1 of the first semiconductor layer Act1 and the channel region C2 of the second semiconductor layer Act2 with a gate insulating layer 120 therebetween. In an exemplary embodiment, the first and second gate electrodes G1 and G2 may include a single layer or a multi-layer including a conductive material including at least one of Mo, Al, Cu, and Ti, for example. Although FIG. 3 illustrates that the first gate electrode G1 and the second gate electrode G2 are disposed in the same layer, the invention is not limited thereto. In another exemplary embodiment, the first gate electrode G1 and the second gate electrode G2 may be respectively disposed in different layers.

Although FIG. 3 illustrates a top-gate type TFT in which the first and second gate electrodes G1 and G2 are respectively disposed over the first and second semiconductor layers Act1 and Act2, the invention is not limited thereto. In another exemplary embodiment, the TFT may be a bottom-gate type TFT in which the first and second gate electrodes G1 and G2 are respectively disposed below the first and second semiconductor layers Act1 and Act2.

The storage capacitor Cst may include a first storage capacitor plate CE1 and a second storage capacitor plate CE2 overlapping each other. In an exemplary embodiment, the first and second storage capacitor plates CE1 and CE2 may include a low-resistance conductive material including at least one of Mo, Al, Cu, and Ti, for example.

The storage capacitor Cst may overlap the first TFT T1, and the first TFT T1 may be a driving TFT. Although FIG. 3 illustrates a case where the storage capacitor Cst overlaps the first TFT T1 and thereby the first storage capacitor plate CE1 serves as the first gate electrode G1 of the first TFT T1, the invention is not limited thereto. In another exemplary embodiment, the storage capacitor Cst may not overlap the first TFT T1.

A buffer layer 110 may be disposed between the substrate 100 and the first and second TFTs T1 and T2. The buffer layer 110 may include an inorganic insulating layer. In an exemplary embodiment, the buffer layer 110 may include a single layer or a multi-layer including at least one of SiON, SiOx, and SiNx, for example.

The gate insulating layer 120 may be disposed between the first and second gate electrodes G1 and G2 and the first and second semiconductor layers Act1 and Act2. The gate insulating layer 120 may include an inorganic insulating layer. In an exemplary embodiment, the gate insulating layer 120 may include a single layer or a multi-layer including at least one of SiON, SiOx, and SiNx, for example.

The first and second TFTs T1 and T2 may be covered by an inter-insulating layer 130. FIG. 3 illustrates that the inter-insulating layer 130 includes first and second inter-insulating layers 131 and 132. The first inter-insulating layer 131 may be disposed directly on the first and second TFTs T1 and T2 and/or directly on the first storage capacitor plate CE1. The second inter-insulating layer 132 may be disposed on the second storage capacitor plate CE2. The first and second inter-insulating layers 131 and 132 may include an inorganic insulating material. In an exemplary embodiment, each of the first and second inter-insulating layers 131 and 132 may include a single layer or a multi-layer including at least one of SiON, SiOx, and SiNx, for example. In an exemplary embodiment, the first inter-insulating layer 131 may include a single layer including SiNx, and the second inter-insulating layer 132 may include a multi-layer including SiNx and SiOx, for example. In the specification, the inter-insulating layer may be understood as an insulating layer between the inner wiring 210 and a conductive layer 230 and/or between the outer wiring 220 and the conductive layer 230 in the non-display area NDA and understood as representing the first inter-insulating layer 131, representing the second inter-insulating layer 132, or representing the first and second inter-insulating layers 131 and 132.

A data line DL may be disposed on the inter-insulating layer 130. The data line DL may be electrically connected to a switching TFT (not shown) to provide a data signal. In an exemplary embodiment, the data line DL may include a single layer or a multi-layer including at least one of Al, Cu, Ti, and an alloy thereof, for example. In an exemplary embodiment, the data line DL may include a three-story layer of Ti/Al/Ti, for example.

The data line DL may be covered by an inorganic protective layer PVX. In an exemplary embodiment, the inorganic protective layer PVX may be an inorganic insulating layer and may include a single layer or a multi-layer including SiNx and SiOx, for example. Though not shown, the inorganic protective layer PVX may cover and protect some wirings exposed in the non-display area NDA. Wirings (not shown) simultaneously provided during the same process as a process of the data line DL may be exposed to a portion of the substrate 100 (for example, a portion of the non-display area NDA). An exposed portion of the wirings may be damaged by an etchant used when a pixel electrode 310, which will be described later, is patterned. However, according to the exemplary embodiment, since the inorganic protective layer PVX covers the data line DL and at least some of the wirings simultaneously provided with the data line DL, the wirings may be prevented from being damaged during a patterning process of the pixel electrode 310.

The driving voltage line PL may be disposed in a layer different from a layer in which the data line DL is disposed. In the specification, it will be understood that when "A and B are disposed in different layers", at least one insulating layer is disposed between A and B, and thereby at least one of A and B is disposed below the at least one insulating layer and the other is disposed over the at least one insulating layer. A first organic insulating layer 141 may be disposed between the driving voltage line PL and the data line DL. In an exemplary embodiment, the first organic insulating layer 141 is a planarization layer and may include a general-purpose polymer such as an imide-based polymer, polymethylmethacrylate ("PMMA") or polystyrene ("PS"), or polymer derivatives having a phenol-based group, an acryl-based polymer, an aryl ether-based polymer, an amide-based polymer, a fluorine-based polymer, a p-xylene-based polymer, a vinyl alcohol-based polymer, or any combinations thereof.

In an exemplary embodiment, the driving voltage line PL may include a single layer or a multi-layer including at least one of Al, Cu, Ti, and an alloy thereof, for example. In an exemplary embodiment, the driving voltage line PL may include a three-story layer of Ti/Al/Ti, for example. Although FIG. 3 illustrates a configuration in which the driving voltage line PL is disposed on only the first organic insulating layer 141, the invention is not limited thereto. In another exemplary embodiment, the driving voltage line PL may be connected to an additional lower voltage line (not shown) simultaneously provided with the data line DL through a through hole (not shown) defined in the first organic insulating layer 141 to reduce a resistance.

A second organic insulating layer 142 may cover the driving voltage line PL. In an exemplary embodiment, the second organic insulating layer 142 is a planarization layer and may include a general-purpose polymer such as an imide-based polymer, PMMA or PS, or polymer derivatives having a phenol-based group, an acryl-based polymer, an aryl ether-based polymer, an amide-based polymer, a fluorine-based polymer, a p-xylene-based polymer, a vinyl alcohol-based polymer, or any combinations thereof.

The OLED 300 including the pixel electrode 310, an opposite electrode 330, and an intermediate layer 320 including an emission layer and disposed between the pixel electrode 310 and the opposite electrode 330, may be disposed on the second organic insulating layer 142.

A pixel-defining layer 150 may be disposed on the pixel electrode 310. The pixel-defining layer 150 defines a pixel by defining an opening corresponding to respective sub-pixels, that is, an opening exposing at least a central portion of the pixel electrode 310. Also, the pixel-defining layer 150 may prevent an arc, etc., from occurring between the pixel electrode 310 and the opposite electrode 330 by increasing a distance between the edge of the pixel electrode 310 and the opposite electrode 330. In an exemplary embodiment, the pixel-defining layer 150 may include, for example, an organic material such as PI or hexamethyldisiloxane ("HMDSO").

The pixel electrode 310 may be electrically connected to a pixel circuit including, for example, the first and second TFTs T1 and T2 and the storage capacitor Cst through a first connection metal CM1 and a second connection metal CM2.

The intermediate layer 320 may include a low molecular or polymer material. In the case where the intermediate layer 320 includes a low molecular material, the intermediate layer 320 may have a structure in which a hole injection layer ("HIL"), a hole transport layer ("HTL"), an emission layer ("EML"), an electron transport layer ("ETL"), an electron injection layer ("EIL"), etc., are stacked in a single or a composite configuration, and may include various organic materials such as copper phthalocyanine (CuPc), N,N'-Di(naphthalene-1-yl)-N,N'-diphenyl-benzidine ("NPB"), and tris-8-hydroxyquinoline aluminum (Alq3). These layers may be provided by vacuum evaporation.

In the case where the intermediate layer 320 includes a polymer material, the intermediate layer 320 may generally have a structure including an HTL and an EML. In this case, the HTL may include PEDOT, and the EML may include a polymer material such as polyphenylene vinylene ("PPV")-based material and a polyfluorene-based material. The structure of the intermediate layer 320 is not limited to the above-described structure and may have various structures. In an exemplary embodiment, the intermediate layer 320 may include a layer having one body over a plurality of pixel electrodes 310 or may include a layer patterned to respectively correspond to the plurality of pixel electrodes 310, for example.

The opposite electrode 330 may cover the display area DA. That is, the opposite electrode 330 may have one body over the plurality of OLEDs 300.

Since the OLED 300 may be easily damaged by external moisture or oxygen, the OLED 300 may be protected by being covered by an encapsulation layer 400. The encapsulation layer 400 may cover the display area DA and extend to the outside of the display area DA. The encapsulation layer 400 includes at least one inorganic insulating layer and at least one organic insulating layer. In an exemplary embodiment, the encapsulation layer 400 may include a first inorganic encapsulation layer 410, an organic encapsulation layer 420, and a second inorganic encapsulation layer 430, for example.

In an exemplary embodiment, the first inorganic encapsulation layer 410 may cover the opposite electrode 330 and include SiOx, SiNx, and/or SiON, for example. Though not shown, other layers such as a capping layer may be disposed between the first inorganic encapsulation layer 410 and the opposite electrode 330. Since the first inorganic encapsulation layer 410 is disposed along a structure thereunder, an upper surface of the first inorganic encapsulation layer 410 is not planarized. The organic encapsulation layer 420 covering the first inorganic encapsulation layer 410 may have a flat upper surface at least corresponding to the display area DA. In an exemplary embodiment, the organic encapsulation layer 420 may include at least one of PET, PEN, PC, PI, polyethylene sulfonate, polyoxymethylene ("POM"), polyarylate, and HMDSO, for example. In an exemplary embodiment, the second inorganic encapsulation layer 430 may cover the organic encapsulation layer 420 and include SiOx, SiNx, and/or SiON, for example.

An optical film 500 may be disposed on the encapsulation layer 400. The optical film 500 may include a polarization plate. The polarization plate may reduce external light reflection, and a layer including a black matrix and a color filter may be used instead of the polarization plate. Though not shown, various functional layers including touch electrode layers may be further provided on the encapsulation layer 400.

Referring to the non-display area NDA of FIG. 3 taken along line B-B' of FIG. 1, the buffer layer 110, the gate insulating layer 120, the inter-insulating layer 130, and the inorganic protective layer PVX may be collectively referred to as inorganic insulating layers IL.

Although FIG. 3 illustrates that a display device is not bent, for convenience of description, the substrate 100, etc., of the display device according to the invention may be bent in the bent area BA as illustrated in FIG. 2. In an exemplary embodiment, as illustrated in FIG. 3, the display device is manufactured while the substrate 100 is approximately flat, and after that, the substrate 100 is bent in the bent area BA and may have the shape illustrated in FIG. 2, for example. While the substrate 100, etc., are bent in the bent area BA, tensile stress may be applied to elements disposed inside the bent area BA.

To prevent a crack from occurring in the inorganic insulating layer IL due to tensile stress, an opening OP corresponding to the bent area BA is defined in the inorganic insulating layer IL. In the specification, "corresponding" may be understood as "overlapping". Openings 110*a*, 120*a*, 130*a*, and PVXa corresponding to the bent area BA may be respectively defined in the buffer layer 110, the gate insulating layer 120, the inter-insulating layer 130, and the inorganic protective layer PVX. The opening 130*a* of the inter-insulating layer 130 may include the openings 131*a* and 132*a* respectively of the first and second inter-insulating layers 131 and 132. The opening OP of the inorganic insulating layer IL is defined such that the opening OP passes through the inorganic insulating layer IL as illustrated in FIG. 3.

An area of the opening OP may be wider than an area of the bent area BA. Regarding this, FIG. 3 illustrates that a width OW of the opening OP is wider than a width of the bent area BA. The area of the opening OP may be defined as an area of an opening having a smallest area among the openings 110*a*, 120*a*, 130*a*, and PVXa respectively of the buffer layer 110, the gate insulating layer 120, the inter-insulating layer 130, and the inorganic protective layer PVX.

The first organic insulating layer 141 may fill the opening OP. The first organic insulating layer 141 is a layer disposed on the inorganic protective layer PVX. An end portion of the inorganic protective layer PVX may be covered by the first organic insulating layer 141 while covering an end portion of the inter-insulating layer 130 in a region adjacent to the bent area BA.

The first organic insulating layer 141 may be disposed not only in the opening OP of the inorganic insulating layer IL defined in the bent area BA but also on the data line DL and the first connection metal CM1 in the display area DA. Due to the opening OP, a level L1 of a portion of the first organic insulating layer 141 corresponding to the bent area BA is lower than a level L2 of a portion of the first organic insulating layer 141 corresponding to a non-bent area (e.g. the display area DA, or a portion of the first and second areas 1A and 2A in which the inner and outer wirings 210 and 220 are located). Here, it will be understood that a "level of A" represents a "vertical distance/height from the substrate 100 to an upper surface of A".

The first organic insulating layer 141 may contact the substrate 100 through the opening OP. The substrate 100 may include a base layer and an inorganic barrier layer. In an exemplary embodiment, as illustrated in FIG. 4A, the substrate 100 may include a first base layer 101, a first inorganic barrier layer 102, a second base layer 103, and a second inorganic barrier layer 104 sequentially stacked thereon, for example. In the case where an uppermost layer of the substrate 100 is an inorganic barrier layer, for example, the second inorganic barrier layer 104, an opening 104*a* corresponding to the bent area BA may be defined in the second inorganic barrier layer 104 and thus the first organic insulating layer 141 may directly contact the base layer of the substrate 100, for example, the second base layer 103.

In an exemplary embodiment, the first and second base layers 101 and 103 may include PI, PES, PAR, PEI, PEN, PET, PPS, polyarylate, PC, cellulose triacetate ("TAC"), CAP, cyclic olefin polymer, and cyclic olefin copolymer, for example.

In an exemplary embodiment, the first and second inorganic barrier layers 102 and 104 may include a single layer or a multi-layer including an inorganic material such as SiOx and/or SiNx, for example.

Referring to FIG. 4A, in a region adjacent to the bent area BA, a stacked body including the gate insulating layer 120 and the inter-insulating layer 130 may form a step difference with the buffer layer 110. The inorganic protective layer PVX may cover an upper surface of an end portion of the inter-insulating layer 130 adjacent to the bent area BA, and an end portion of the inorganic protective layer PVX may extend toward a center of the bent area BA to cover lateral surfaces of the gate insulating layer 120 and the inter-insulating layer 130, and an upper surface of the buffer layer 110.

In another exemplary embodiment, referring to FIG. 4B, in a region adjacent to the bent area BA, a stacked body including the buffer layer 110, the gate insulating layer 120, and the inter-insulating layer 130 may form a step difference with the second inorganic barrier layer 104. The inorganic protective layer PVX may cover an upper surface of an end portion of the inter-insulating layer 130 adjacent to the bent area BA, and an end portion of the inorganic protective layer PVX may extend toward a center of the bent area BA to cover lateral surfaces of the buffer layer 110, the gate insulating layer 120, and the inter-insulating layer 130, and an upper surface of the second inorganic barrier layer 104.

As illustrated in FIGS. 4A and 4B, in the case where an uppermost layer of the substrate 100 includes the second inorganic barrier layer 104, the inorganic insulating layers IL may collectively denote the second inorganic barrier layer 104, the buffer layer 110, the gate insulating layer 120, the inter-insulating layer 130, and the inorganic protective layer PVX.

In a region adjacent to the bent area BA, upper insulating layers (e.g. the second inter-insulating layer, or the first and second inter-insulating layers) disposed over the inner and outer wirings 210 and 220, and lower insulating layers (e.g. the buffer layer and the second inorganic barrier layer, or the second inorganic barrier layer) disposed below the inner and outer wirings 210 and 220 may form a step difference, and the inorganic protective layer PVX may cover an upper surface of the lower insulating layer as described above.

In the case where the upper insulating layer and the lower insulating layer form a step difference, the lower insulating layer may further protrude toward a center of the bent area BA, and a width OW of the opening OP of the inorganic insulating layer IL in the bent area BA may be defined by the lower insulating layer. Selectively, an end portion of the inorganic protective layer PVX may be disposed on an end portion of the lower insulating layer, and thus the width OW of the opening OP of the inorganic insulating layer IL may be defined by the lower insulating layer and the inorganic protective layer PVX. In an exemplary embodiment, as illustrated in FIG. 4A, the width OW may be defined by the openings PVXa, 110a, and 104a respectively of the inorganic protective layer PVX, the buffer layer 110, and the second inorganic barrier layer 104. In another exemplary embodiment, as illustrated in FIG. 4B, the width OW may be defined by the openings PVXa and 104a respectively of the inorganic protective layer PVX and the second inorganic barrier layer 104.

Referring back to FIG. 3, the inner wiring 210 may be electrically connected to a pixel in the display area DA. In an exemplary embodiment, the inner wiring 210 may be electrically connected to the first and second TFTs T1 and T2, and/or wirings such as the data line DL, and a pixel circuit is electrically connected to a display element, for example. The inner wiring 210 may partially extend to the display area DA, or may be electrically connected to a conductive layer/wiring (not shown) outside the display area DA.

The outer wiring 220 may be connected, in the non-display area NDA, to a wiring (not shown) disposed in a layer different from a layer in which the outer wiring 220 is disposed, and/or the terminal unit 20 (refer to FIG. 1) of the non-display area NDA. In an alternative exemplary embodiment, one end portion of the outer wiring 220 may be exposed to the outside and connected to an electronic element or the flexible film 60, etc., described above with reference to FIG. 1.

The inner wiring 210, which is spaced apart from the outer wiring 220 with the bent area BA therebetween, may be electrically connected to the outer wiring 220 through the connection wiring 240 which is a bridge wiring. FIG. 3 illustrates that the conductive layer 230 is disposed between the connection wiring 240 and the inner and outer wirings 210 and 220, and the conductive layer 230 electrically connects the inner and outer wirings 210 and 220 to the connection wiring 240.

The conductive layer 230 may contact the inner and outer wirings 210 and 220 through a first contact hole CNT1 of the inter-insulating layer 130, and the connection wiring 240 may contact the conductive layer 230 through a second contact hole CNT2 of the first organic insulating layer 141. In this case, a hole PVX-h corresponding to the second contact hole CNT2 may be defined in the inorganic protective layer PVX.

As described above, after the display device is manufactured while the substrate 100 is approximately flat, the display device is bent. A defect such as a crack, or disconnection, etc., in the conductive layer 230 may occur during a bending process. To prevent this, the connection wiring 240 may include a material having relatively high elongation. Also, efficiency in electric signal transfer in the display device may be improved or a defect occurrence rate during a manufacturing process may be reduced by forming the inner and outer wirings 210 and 220 of the first and second areas 1A and 2A with a material having electrical/physical properties different from those of the connection wiring 240.

In an exemplary embodiment, the inner and outer wirings 210 and 220 may include Mo, and the connection wiring 240 may include Al, for example. The inner and outer wirings 210 and 220 and the connection wiring 240 may include a single layer or a multi-layer, for example. In an exemplary embodiment, the connection wiring 240 includes a three-story multi-layer of Ti/Al/Ti, a thickness of Ti being equal to or less than about 0.15 times a thickness of Al, for example, equal to or less than about 0.12 times the thickness of Al.

FIG. 3 illustrates a case where the inner and outer wirings 210 and 220 are provided during a process of forming the first and second gate electrodes G1 and G2 and include the same material as that of the first and second gate electrodes G1 and G2. The conductive layer 230 may be provided during a process of forming the data line DL and may include the same material as that of the data line DL. Therefore, the inorganic protective layer PVX covering the data line DL may also cover the conductive layer 230. The connection wiring 240 may be provided during a process of forming the driving voltage line PL, and may include the same material as that of the driving voltage line PL.

A protective layer 600A may be disposed on the connection wiring 240. Although the second organic insulating layer 142 and the pixel-defining layer 150 in the display area DA may extend to the non-display area NDA to form the protective layer 600A covering the connection wiring 240, the invention is not limited thereto. In another exemplary embodiment, the protective layer 600A covering the connection wiring 240 in the non-display area NDA may include at least one of the second organic insulating layer 142 and the pixel-defining layer 150, or may be provided during a separate process (e.g. coating and hardening a material in a liquid state or a paste form) by an organic material different from that of the second organic insulating layer 142 or the pixel-defining layer 150.

Figure 5:
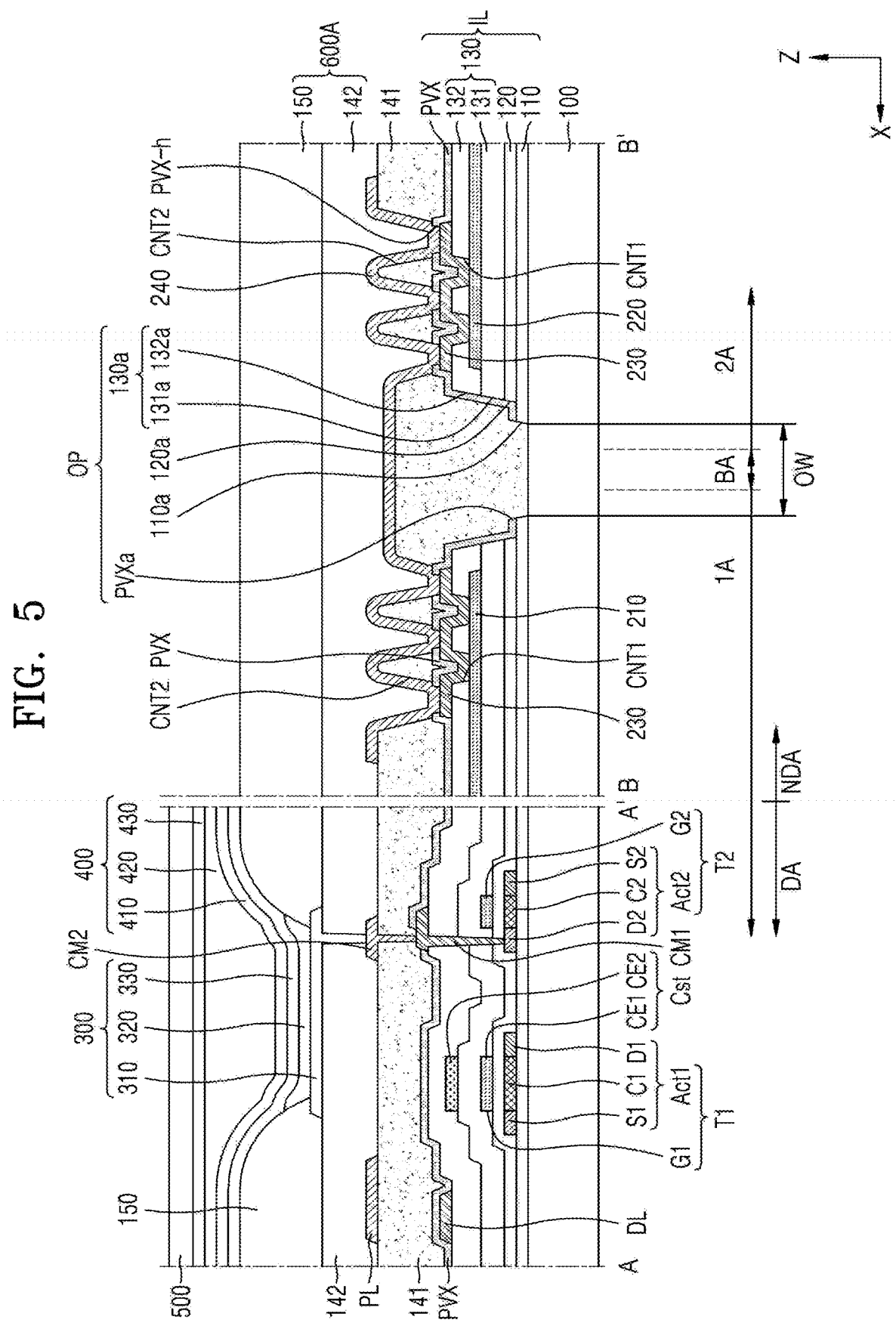
FIG. 5 is a cross-sectional view of a display device according to another exemplary embodiment and corresponding to cross-sections of the display device taken along lines A-A' and B-B' of FIG. 1.

FIG. 5 is a cross-section of a display device according to another exemplary embodiment and may correspond to cross-sections taken along lines A-A' and B-B' of FIG. 1. Since FIG. 5 illustrates the same configuration as the configuration described with reference to FIG. 3 except the arrangement of the inner and outer wirings 210 and 220, differences are mainly described below.

Although FIG. 3 illustrates the inner and outer wirings 210 and 220 are disposed in a layer in which the first and second gate electrodes G1 and G2 are disposed, for example, on the gate insulating layer 120, the invention is not limited thereto. In another exemplary embodiment, as illustrated in FIG. 5, the inner and outer wirings 210 and 220 may be disposed in a layer in which the second storage capacitor plate CE2 of the storage capacitor Cst is disposed, for example, on the first inter-insulating layer 131.

Although FIGS. 3 and 5 illustrate that the inner and outer wirings 210 and 220 are disposed in the same layer, the invention is not limited thereto. In another exemplary embodiment, like the first and second gate electrodes G1 and G2, one of the inner and outer wirings 210 and 220 may be disposed on the gate insulating layer 120, and like the second storage capacitor plate CE2, the other of the inner and outer wirings 210 and 220 may be disposed on the first inter-insulating layer 131.

Though not shown in FIG. 5, characteristics described with reference to FIGS. 4A and 4B are equally applicable to an exemplary embodiment illustrated in FIG. 5.

Figure 6:
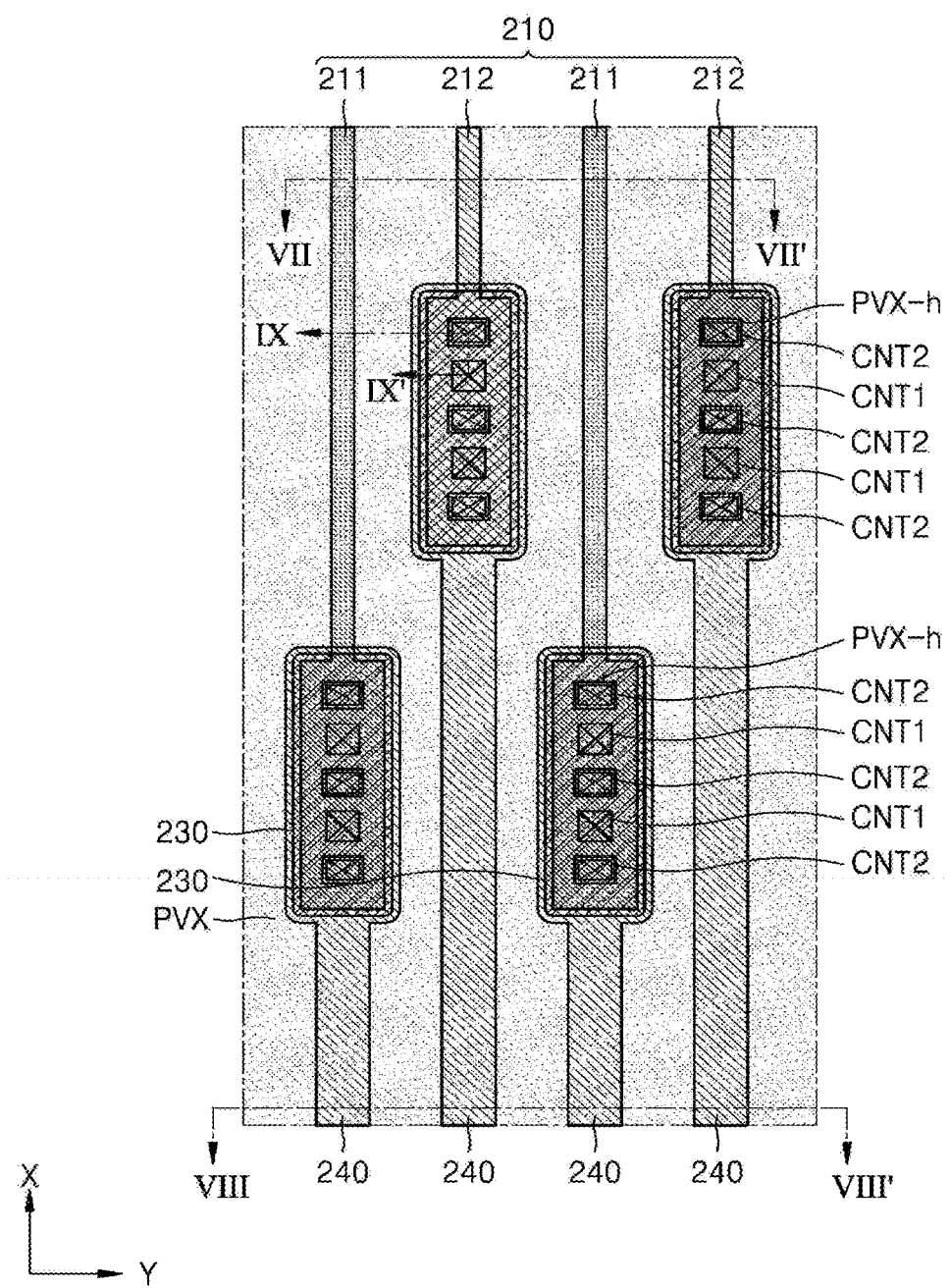
FIG. 6 is a plan view of a portion of a wiring unit of a display device according to an exemplary embodiment.
Figure 7:
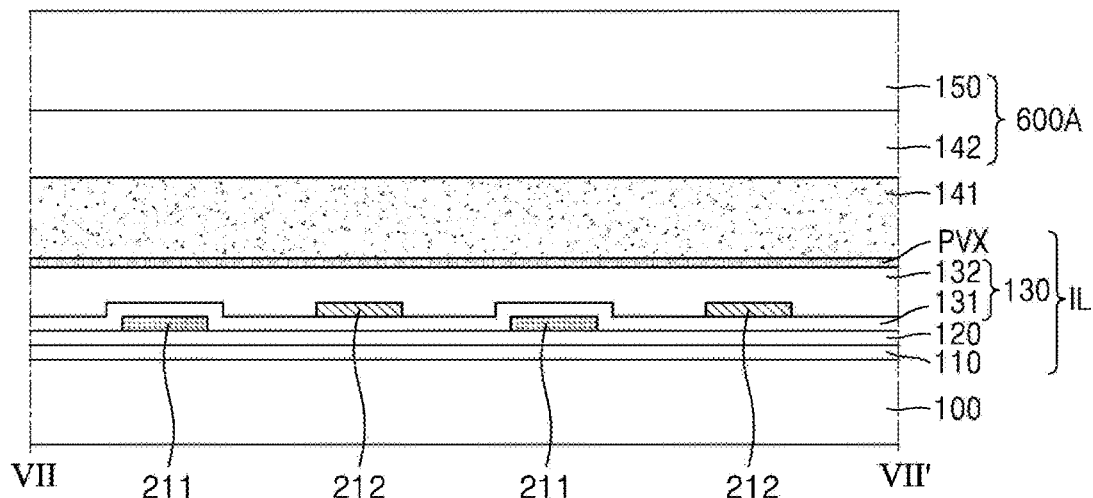
FIG. 7 is a cross-sectional view of the wiring unit taken along line VII-VII' of FIG. 6.
Figure 8:
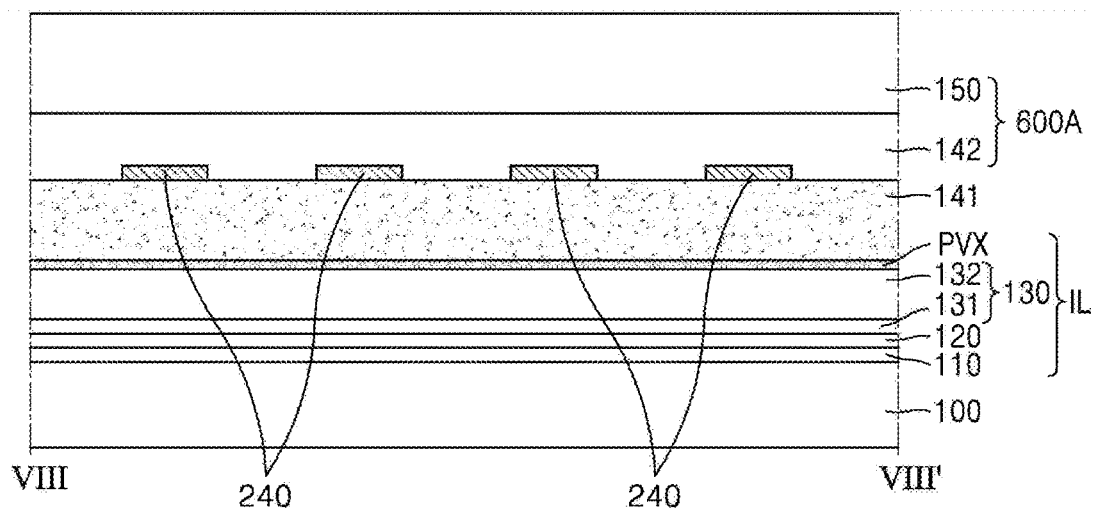
FIG. 8 is a cross-sectional view of the wiring unit taken along line VIII-VIII' of FIG. 6.
Figure 9:
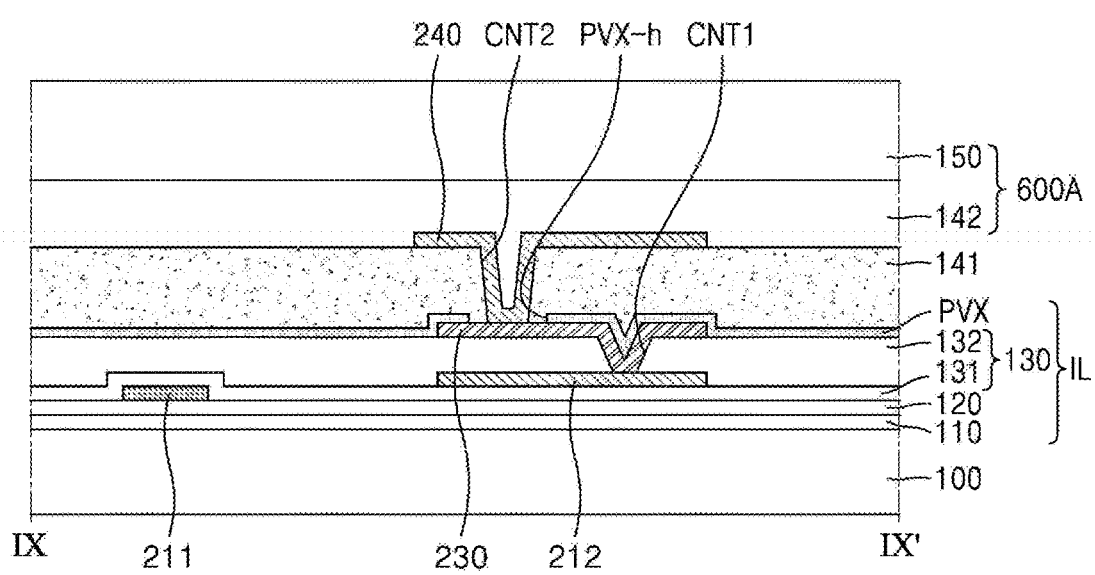
FIG. 9 is a cross-sectional view of the wiring unit taken along line IX-IX' of FIG. 6.

FIG. 6 is a plan view of a portion of a wiring unit of a display device according to an exemplary embodiment and may correspond to a portion VI of FIG. 1. FIG. 7 is a cross-sectional view of the wiring unit taken along line VII-VII' of FIG. 6, FIG. 8 is a cross-sectional view of the wiring unit taken along line VIII-VIII' of FIG. 6, and FIG. 9 is a cross-sectional view of the wiring unit taken along line IX-IX' of FIG. 6.

Referring to FIG. 6, the inner wirings 210 may extend in an X direction and may be spaced apart from each other in a Y direction. Hereinafter, for convenience of description, some of the inner wirings 210 are referred to as first inner wirings 211 and the rest of the inner wirings 210 are referred to as second inner wirings 212.

A contact region of the first inner wiring 211 and the connection wiring 240 and a contact region of the second inner wiring 212 and the connection wiring 240 may be alternately disposed. In an exemplary embodiment, the contact region of the first inner wiring 211 and the connection wiring 240 and the contact region of the second inner wiring 212 and the connection wiring 240 may be alternately disposed in zigzags, and thus a distance between the first inner wiring 211 and the second inner wiring 212 may be reduced and a space efficiency may improve, for example.

The first inner wiring 211 and the second inner wiring 212 adjacent to each other may be disposed on different layers. FIG. 7 illustrates that the first inner wiring 211 is disposed on the gate insulating layer 120, and the second inner wiring 212 is disposed on the first inter-insulating layer 131. Since the first inner wiring 211 and the second inner wiring 212 adjacent to each other are disposed in different layers with an insulating layer (e.g. the first inter-insulating layer 131) therebetween, an unnecessary electric short circuit may be prevented, and an interval between the first inner wiring 211 and the second inner wiring 212 may be narrower.

An island type conductive layer 230 is disposed in a contact region of the first inner wiring 211 and the connection wiring 240 and a contact region of the second inner wiring 212 and the connection wiring 240. The conductive layer 230 is connected to the first or second inner wiring 211 or 212 through the first contact hole CNT1, and connected to the connection wiring 240 through the second contact hole CNT2 as described above with reference to FIGS. 3 to 5.

As illustrated in FIG. 8, the connection wiring 240 may be disposed on the same layer. FIG. 8 illustrates that the connection wiring 240 is disposed on the first organic insulating layer 141.

Referring to FIGS. 6 and 9, the second inner wiring 212 is connected to the conductive layer 230 through the first contact hole CNT1 of the second inter-insulating layer 132 therebetween, and the connection wiring 240 is connected to the conductive layer 230 through the second contact hole CNT2 of the first organic insulating layer 141 therebetween.

The inorganic protective layer PVX may be disposed on the conductive layer 230 and may continuously cover the first and second inner wirings 211 and 212 adjacent to each other except the hole PVX-h overlapping the second contact hole CNT2 as illustrated in FIGS. 6 and 9. A first portion of the inorganic protective layer PVX may directly contact the conductive layer 230, and a second portion of the inorganic protective layer PVX may directly contact the second inter-insulating layer 132.

Although the first contact hole CNT1 and the second contact hole CNT2 may be offset, the invention is not limited thereto. In another exemplary embodiment, at least portions of the first and second contact holes CNT1 and CNT2 may overlap each other.

Although a connection structure of the second inner wiring 212, the conductive layer 230, and the connection wiring 240 has been described with reference to FIG. 9 in the above, a connection structure of the first inner wiring 211, the conductive layer 230, and the connection wiring 240 is similar to the structure described with reference to FIG. 9 except that the first inner wiring 211 is disposed below the first inter-insulating layer 131 and a depth of the first contact hole CNT1 is deeper.

Figure 10:
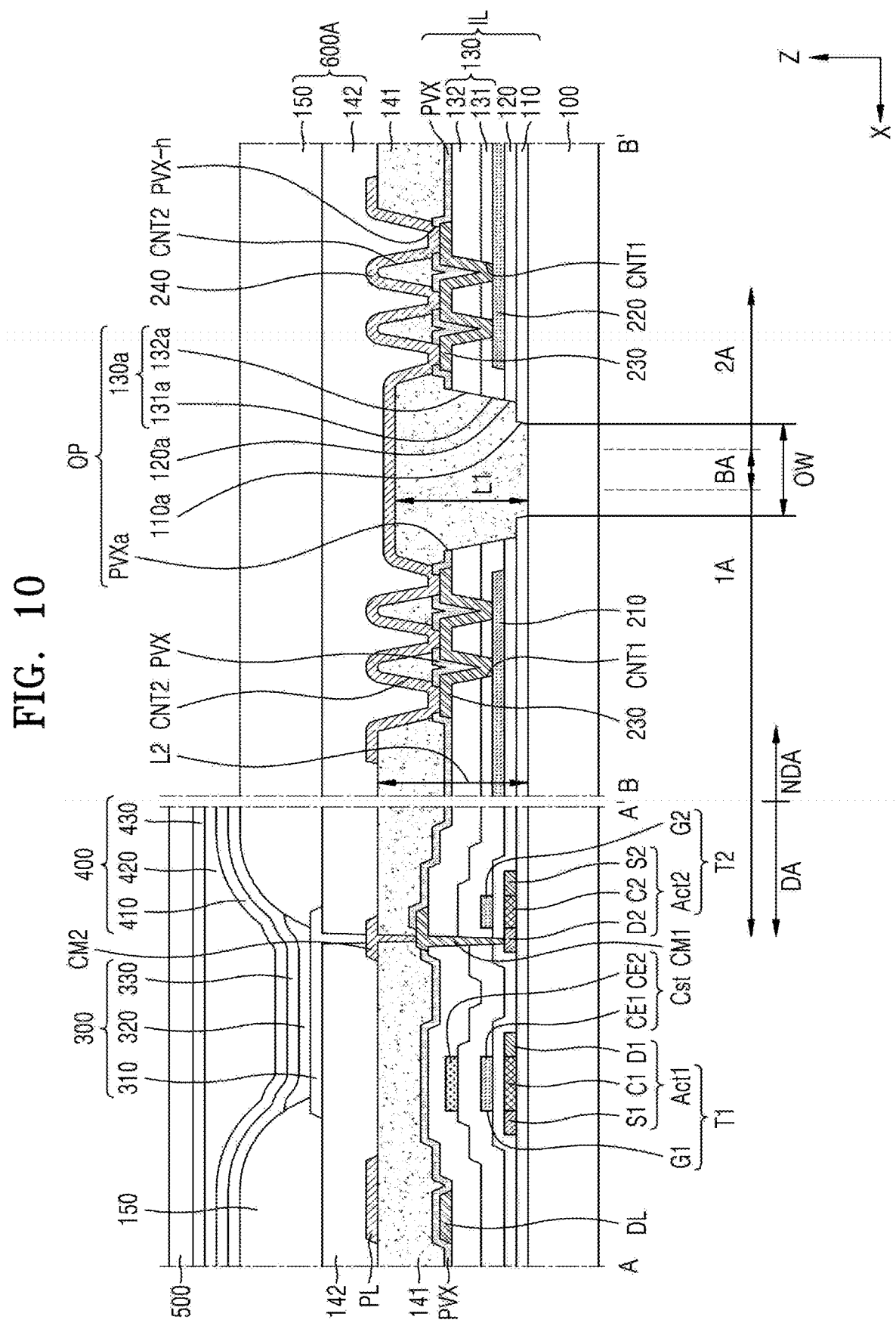
FIG. 10 is a cross-sectional view of a display device according to another exemplary embodiment.

FIG. 10 is a cross-sectional view of a display device according to another exemplary embodiment, and may correspond to cross-sections taken along lines A-A' and B-B' of FIG. 1. In FIG. 10, same reference numerals as those in FIG. 3 denote same members, and differences are mainly described below.

Referring to FIG. 10, the inorganic protective layer PVX may cover an upper surface of an end portion of the inter-insulating layer 130 adjacent to the bent area BA, and unlike the structure described with reference to FIG. 3, the inorganic protective layer PVX may not cover a lateral surface of the inter-insulating layer 130, etc. That is, in a region adjacent to the bent area BA, an end portion of the inorganic protective layer PVX may have substantially the same pattern as that of an end portion of the inter-insulating layer 130.

Since a portion of the first organic insulating layer 141 corresponding to the bent area BA corresponds to the opening OP of the inorganic insulating layer IL, the level L1 of the portion of the first organic insulating layer 141 corresponding to the bent area BA is lower than the level L2 of the portion of the first organic insulating layer 141 corresponding to the non-bent area (e.g. the display area DA, or a portion of the first and second areas 1A and 2A in which the inner and outer wirings 210 and 220 are located) as described above.

Figure 11A:
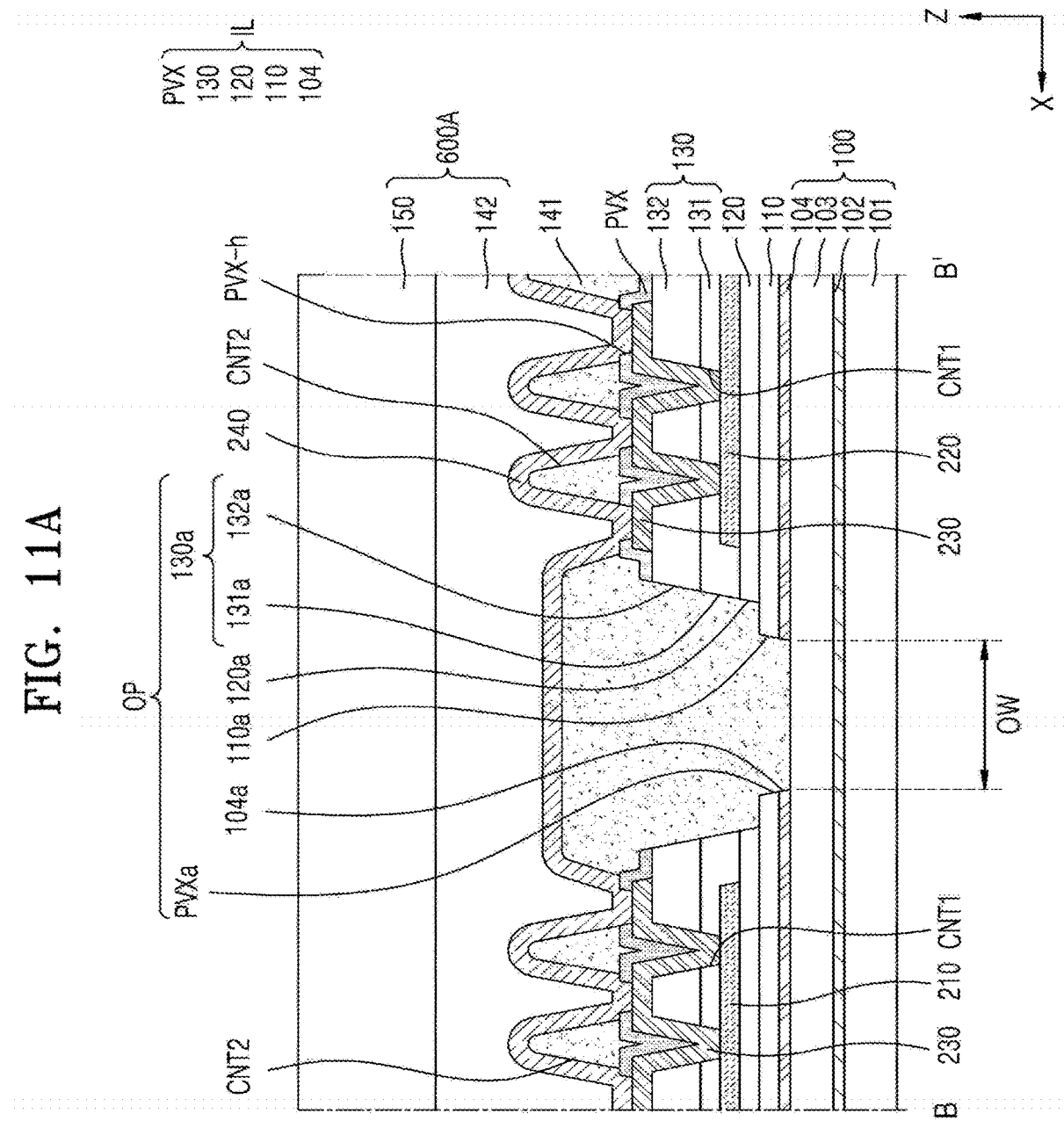
FIG. 11A is an enlarged cross-sectional view of a portion of a display device around a bent area of FIG. 10, according to another exemplary embodiment.
Figure 11B:
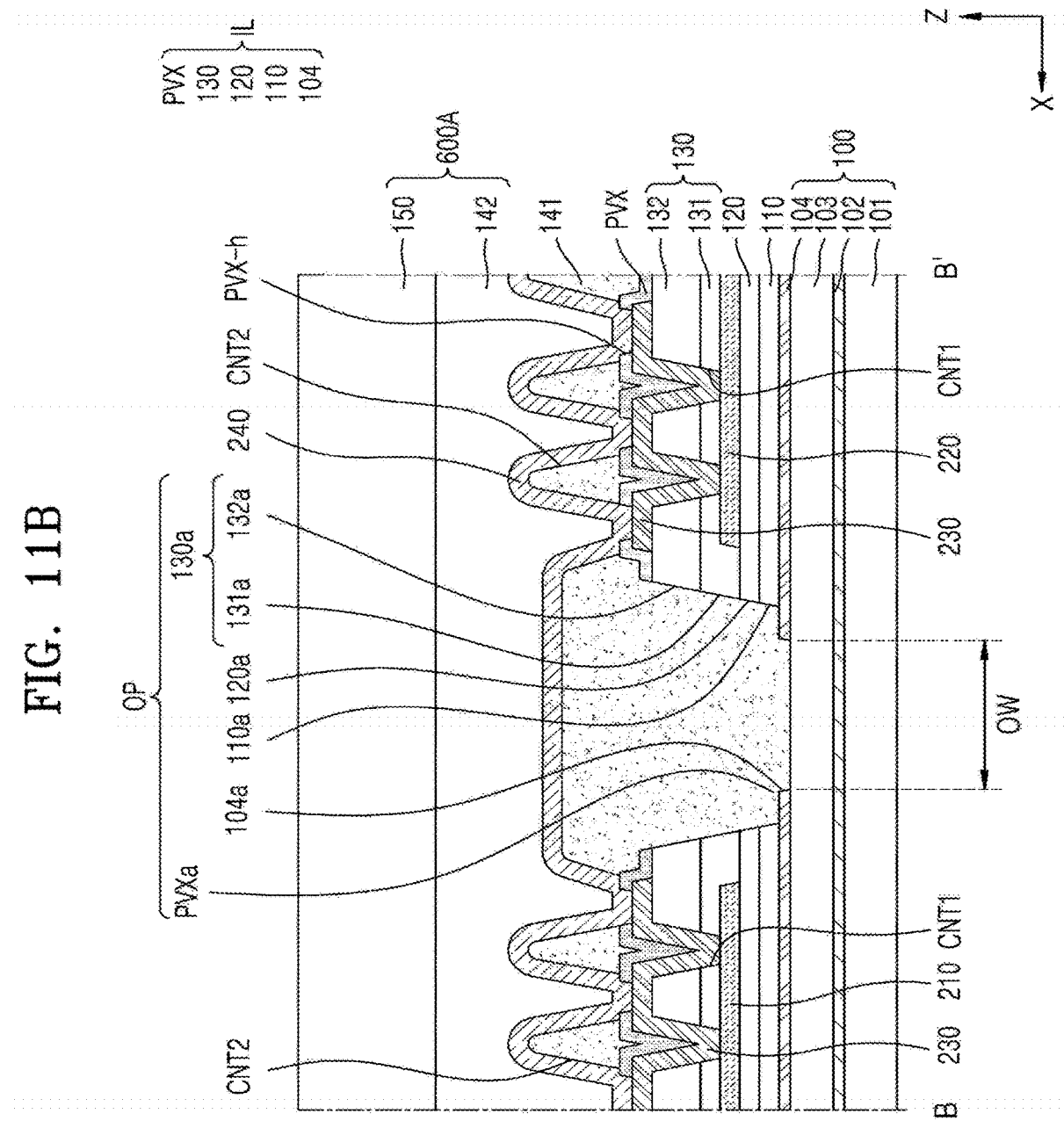
FIG. 11B is a view of a modification of FIG. 11A.

FIG. 11A is an enlarged cross-sectional view of a portion of a display device around the bent area of FIG. 10 according to another exemplary embodiment, and FIG. 11B is a view of a modification of FIG. 11A.

As illustrated in FIGS. 11A and 11B, in the case where an uppermost layer of the substrate 100 includes the second inorganic barrier layer 104, the inorganic insulating layers IL may collectively denote the second inorganic barrier layer 104, the buffer layer 110, the gate insulating layer 120, the inter-insulating layer 130, and the inorganic protective layer PVX as described above.

Referring to FIG. 11A, in a region adjacent to the bent area BA, a stacked body of the gate insulating layer 120 and the inter-insulating layer 130 may form a step difference with a stacked body of the buffer layer 110 and the second inorganic barrier layer 104. Referring to FIG. 11B, in the region adjacent to the bent area BA, a stacked body of the buffer layer 110, the gate insulating layer 120, and the inter-insulating layer 130 may form a step difference with the second inorganic barrier layer 104.

In the region adjacent to the bent area BA, upper insulating layers (e.g. the second inter-insulating layer or the first and second inter-insulating layers) disposed over the inner and outer wirings 210 and 220 may form a step difference with lower insulating layers (e.g. the buffer layer and the second inorganic barrier layer, or the second inorganic barrier layer) disposed below the inner and outer wirings 210 and 220, and the inorganic protective layer PVX covers an upper surface of the upper insulating layers as described above. In the case where the upper insulating layer forms a step difference with the lower insulating layer, the lower insulating layer further protrudes toward a center of the bent area BA, and thus the width OW of the opening OP of the inorganic insulating layer IL may be defined by the lower insulating layer in the bent area BA. In an exemplary embodiment, as illustrated in FIG. 11A, the width OW may be defined by the openings 110a and 104a respectively of the buffer layer 110 and the second inorganic barrier layer 104, for example. In an alternative exemplary embodiment, as illustrated in FIG. 11B, the width OW may be defined by the opening 104a of the second inorganic barrier layer 104.

Figure 12:
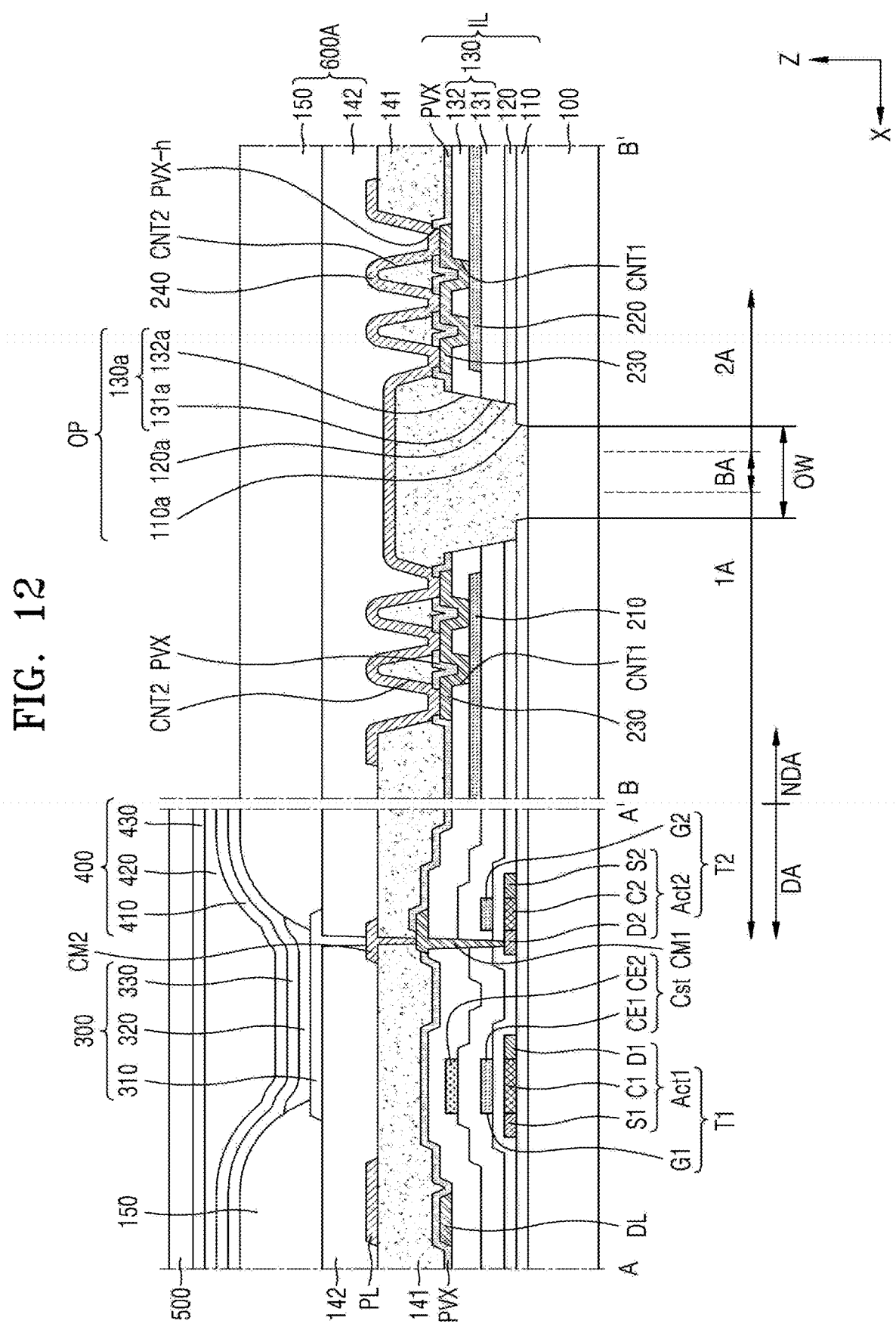
FIG. 12 is a cross-sectional view of a display device according to another exemplary embodiment.

FIG. 12 is a cross-sectional view of a display device according to another exemplary embodiment and may correspond to a cross-sectional view of the display device taken along lines A-A' and B-B' of FIG. 1. Since FIG. 12 illustrates the same configuration as the configuration described with reference to FIG. 10 except the arrangement of the inner and outer wirings 210 and 220, differences are mainly described below.

Although FIG. 10 illustrates the inner and outer wirings 210 and 220 are disposed in a layer in which the first and second gate electrodes G1 and G2 are disposed, for example, on the gate insulating layer 120, the invention is not limited thereto. In another exemplary embodiment, as illustrated in FIG. 12, the inner and outer wirings 210 and 220 may be disposed in a layer in which the second storage capacitor plate CE2 of the storage capacitor Cst is disposed, for example, on the first inter-insulating layer 131.

Although FIGS. 10 and 12 illustrate that the inner and outer wirings 210 and 220 are disposed in the same layer, the invention is not limited thereto. In another exemplary embodiment, like the first and second gate electrodes G1 and G2, one of the inner and outer wirings 210 and 220 may be disposed on the gate insulating layer 120, and like the second storage capacitor plate CE2, the other of the inner and outer wirings 210 and 220 may be disposed on the first inter-insulating layer 131.

FIGS. 13A to 13G are cross-sectional views of a method of manufacturing a display device, according to an exemplary embodiment.

Figure 13A:
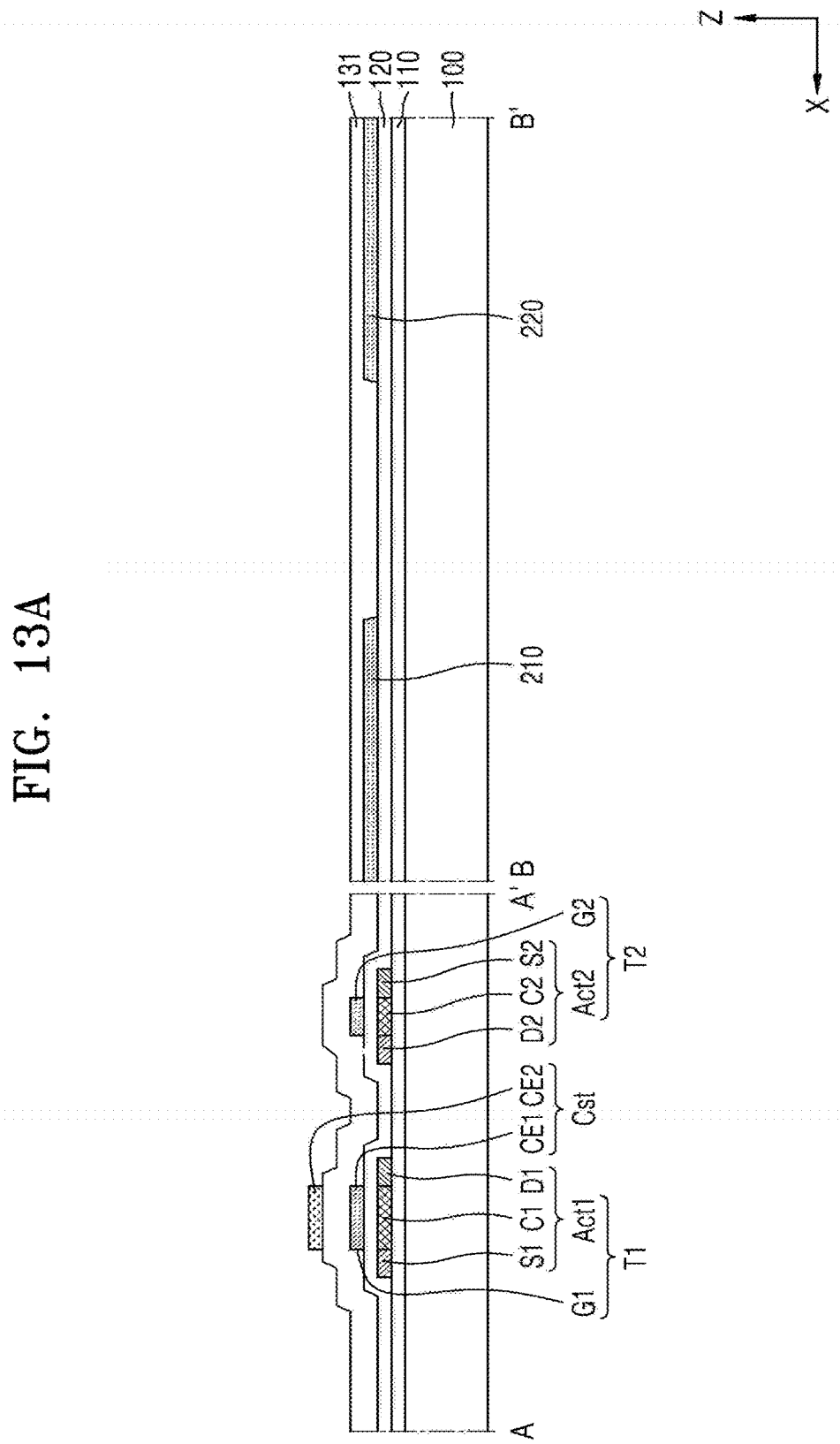
FIGS. 13A to 13G are cross-sectional views of a method of manufacturing a display device, according to an exemplary embodiment.

FIG. 13A is a cross-sectional view corresponding to first to third mask processes.

Referring to FIG. 13A, after forming the buffer layer 110 and the semiconductor material layer on the substrate 100, the first and second semiconductor layers Act1 and Act2 are provided by patterning the buffer layer 110 and the semiconductor material layer (the first mask process). In an exemplary embodiment, the buffer layer 110 may include SiON, SiOx, and/or SiNx, for example.

After forming the gate insulating layer 120 and the conductive material layer, the first and second gate electrodes G1 and G2 are provided in the display area DA, and the inner and outer wirings 210 and 220 are provided in the non-display area NDA by patterning the gate insulating layer 120 and the conductive material layer (the second mask process). Although FIG. 13A illustrates that the first gate electrode G1 serves as the first storage capacitor plate CE1, the invention is not limited thereto as described above.

In an exemplary embodiment, after forming the first and second gate electrodes G1 and G2, the first and second semiconductor layers Act1 and Act2 may be doped with impurities using the first and second gate electrodes G1 and G2 as self-align masks. The impurities may be n-type or p-type impurities. Portions of the first and second semiconductor layers Act1 and Act2 overlapping the first and second gate electrodes G1 and G2 may respectively correspond to the first and second channel regions C1 and C2, and regions respectively at opposite sides of the first and second channel regions C1 and C2 doped with impurities may respectively correspond to the first and second source regions S1 and S2, and the first and second drain regions D1 and D2.

Next, after forming the first inter-insulating layer 131 and the conductive material layer, the second storage capacitor plate CE2 is provided in the display area DA by patterning the first inter-insulating layer 131 and the conductive material layer (the third mask process).

Although FIG. 13A illustrates that one of the first and second TFTs T1 and T2 overlaps the storage capacitor Cst, and thereby the first storage capacitor plate CE1 of the storage capacitor Cst serves as the first gate electrode G1, the storage capacitor Cst may not overlap the first and second TFTs T1 and T2.

Figure 13B:
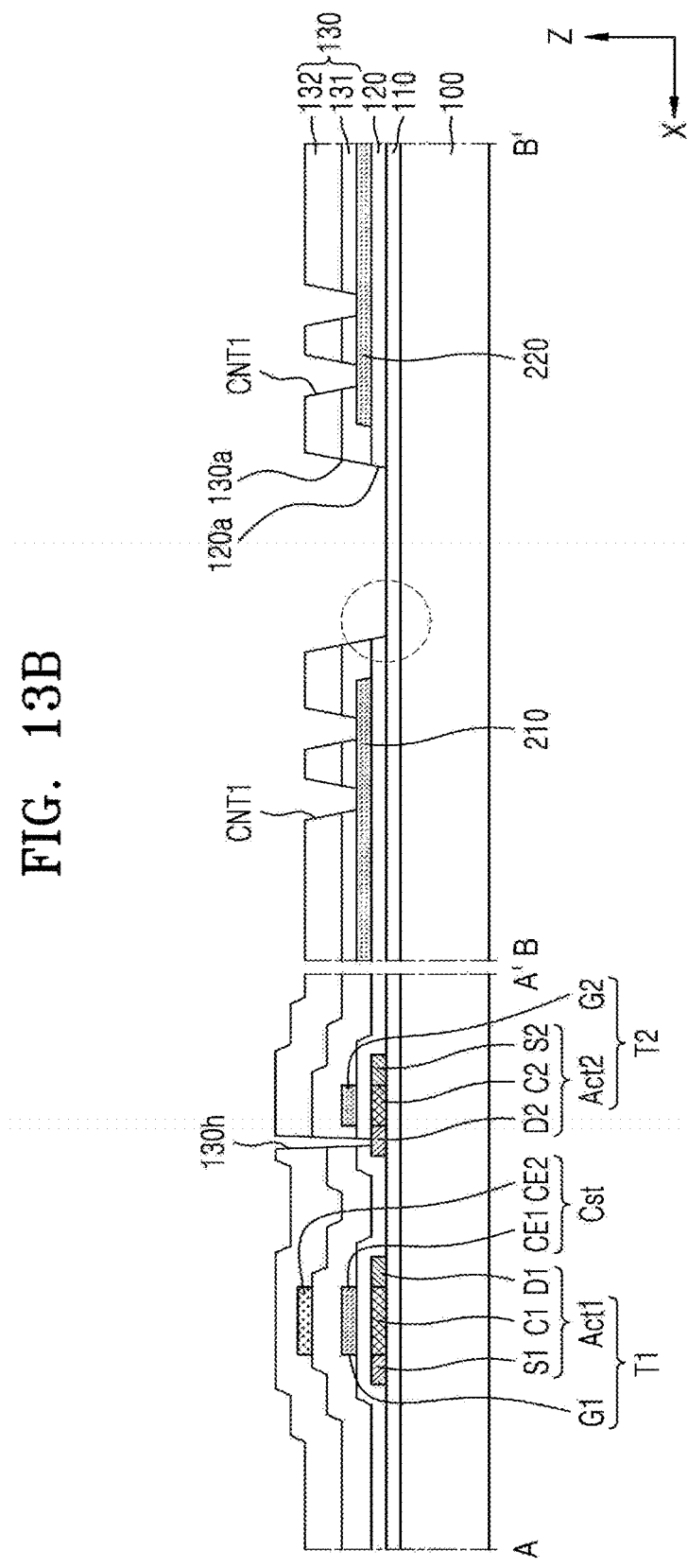
Figure 13B:
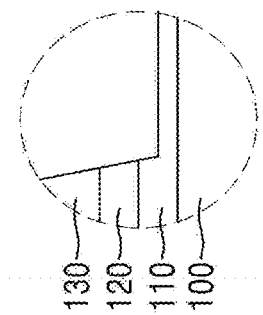
Figure 13B:

FIG. 13B is a cross-sectional view corresponding to a fourth mask process.

Referring to FIG. 13B, the second inter-insulating layer 132 is disposed over the substrate 100 on which the third mask process has been performed. After that, a first hole 130h is defined in the display area DA, and the first contact hole CNT1 is defined in the non-display area NDA by etching the inter-insulating layer 130. In this case, portions of the inter-insulating layer 130 and the gate insulating layer 120 corresponding to the bent area BA may be etched and thus the openings 130a and 120a may be respectively defined in the inter-insulating layer 130 and the gate insulating layer 120.

Depending on an etching condition, the buffer layer 110 may not be consumed as illustrated in an enlarged view of FIG. 13BA, or an upper portion of the buffer layer 110 may be consumed as illustrated in an enlarged view of FIG. 13BB.

Figure 13C:
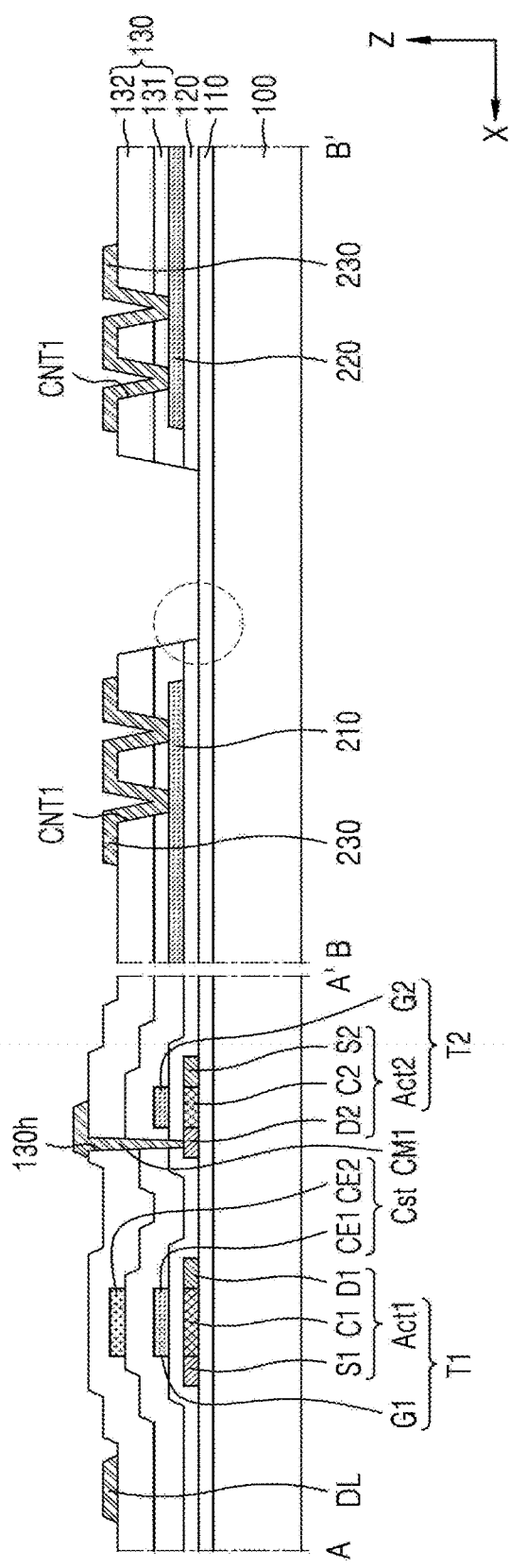
Figure 13C:
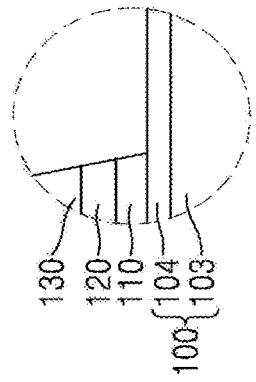
Figure 13C:
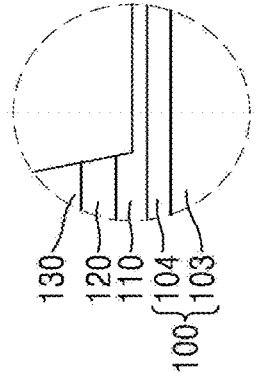

FIG. 13C is a cross-sectional view corresponding to a fifth mask process.

Referring to FIG. 13C, the conductive material layer is disposed over the substrate 100 on which the fourth mask process has been performed, and the conductive material layer is patterned (etched). Therefore, the data line DL and the first connection metal CM1 may be provided in the display area DA, and the conductive layer 230 may be provided in the non-display area NDA.

Depending on an etching condition, the buffer layer 110 corresponding to the bent area BA may be consumed. In an exemplary embodiment, as illustrated in an enlarged view FIG. 13CA, an upper portion of the buffer layer 110 corresponding to the bent area BA may be further consumed, or as illustrated in an enlarged view of FIG. 13CB, a portion of the buffer layer 110 corresponding to the bent area BA may be completely consumed, for example.

Figure 13D:
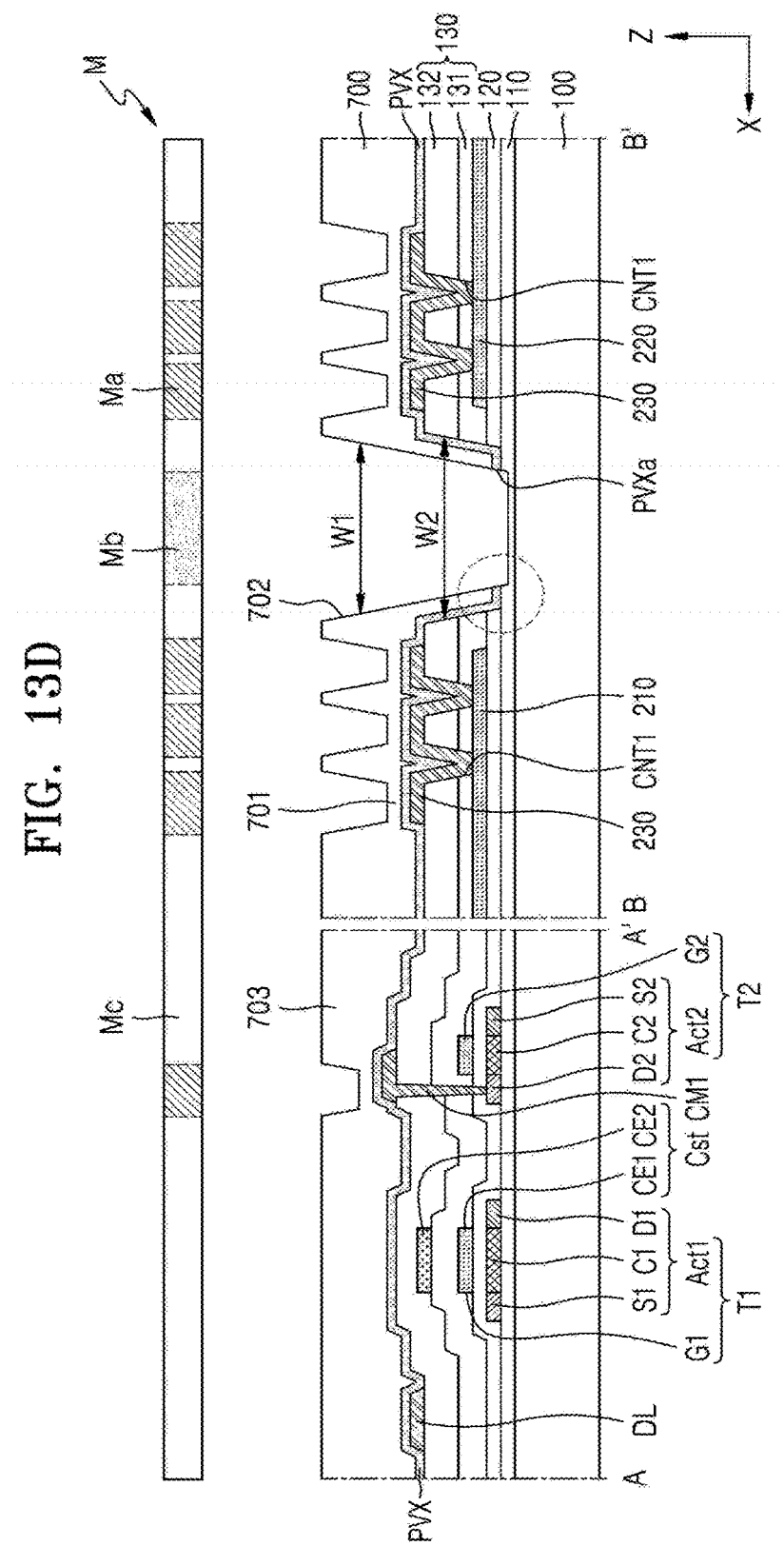
Figure 13D:
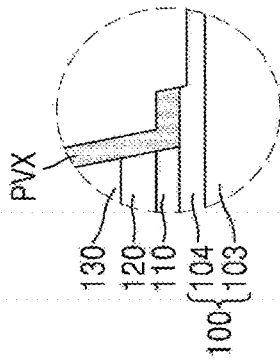
Figure 13D:
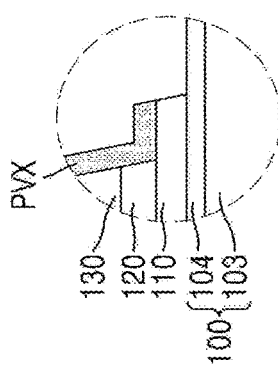
Figure 13D:
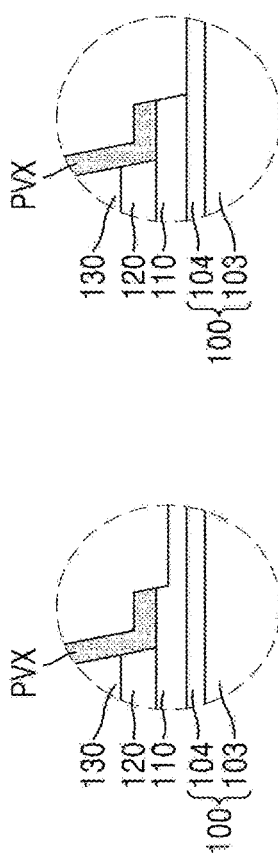
Figure 13E:
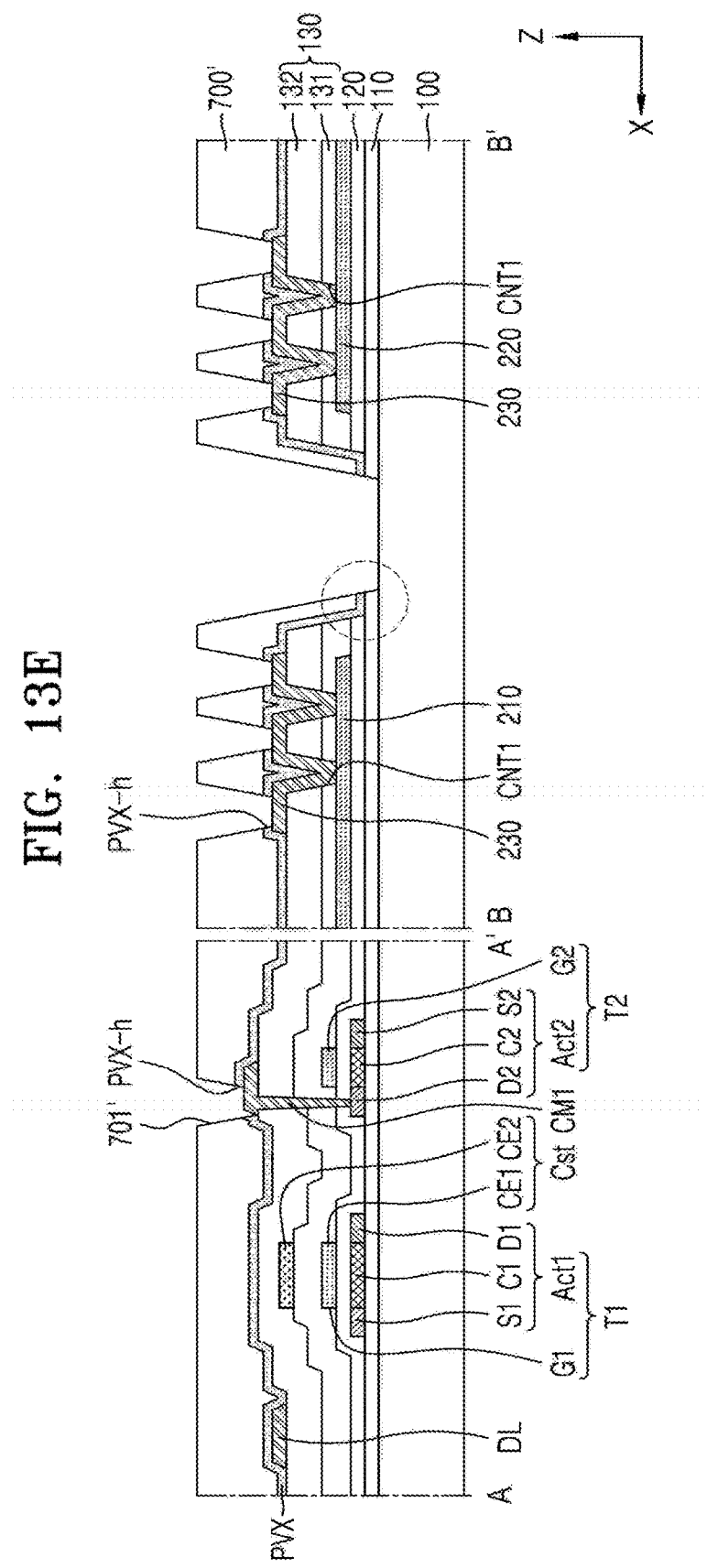
Figure 13E:
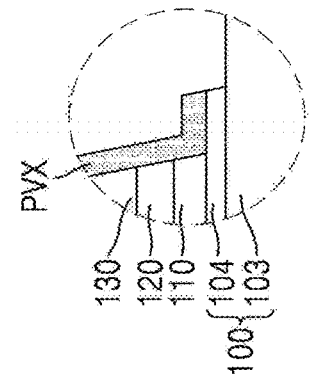
Figure 13E:
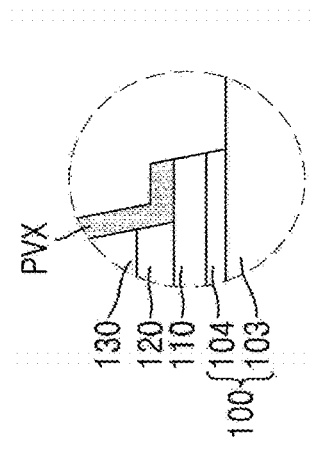

FIGS. 13D and 13E are cross-sectional views corresponding to a sixth mask process.

Referring to FIG. 13D, the inorganic protective layer PVX is disposed over the substrate 100 on which the fifth mask process has been performed. In an exemplary embodiment, the inorganic protective layer PVX may include SiON, SiOx, and/or SiNx, for example. In an exemplary embodiment, the inorganic protective layer PVX may be a layer including SiNx and having a thickness of about 3000 angstroms (Å), for example.

After that, a photosensitive layer 700 is disposed on the inorganic protective layer PVX by a halftone mask M. In an exemplary embodiment, the halftone mask M may include a semi-transmissive portion Ma, a transmissive portion Mb, and a light-blocking portion Mc. A first portion 701 of the photosensitive layer 700 corresponding to the semi-transmissive portion Ma corresponds to the first connection metal CM1 and a portion of the conductive layer 230. A second portion 702 of the photosensitive layer 700 corresponding to the transmissive portion Mb corresponds to an opening passing through the photosensitive layer 700. A third portion 703 of the photosensitive layer 700 corresponding to the light-blocking portion Mc corresponds to the rest of regions other than the first and second portions 701 and 702.

After that, the opening PVXa of the inorganic protective layer PVX corresponding to the bent area BA is provided by etching the inorganic protective layer PVX exposed through the opening of the photosensitive layer 700, that is, the second portion 702.

Depending on a condition of an etching process of defining the opening PVXa of the inorganic protective layer PVX, a portion of the lower inorganic insulating layer(s) disposed below the inorganic protective layer PVX may be etched. In an exemplary embodiment, a portion of the buffer layer 110 corresponding to the opening PVXa may be partially removed as illustrated in an enlarged view of FIG. 13DA. In an alternative exemplary embodiment, a portion of the buffer layer 110 corresponding to the opening PVXa may be completely removed as illustrated in an enlarged view of FIG. 13DB. In an alternative exemplary embodiment, at least a portion of the second barrier layer 104 corresponding to the opening PVXa may be removed as illustrated in an enlarged view of FIG. 13DC.

Next, referring to FIG. 13E, an opening region 701' of a photosensitive layer 700' is defined by performing ashing and removing a portion of the photosensitive layer 700 corresponding to the semi-transmissive portion Ma. After that, the hole PVX-h of the inorganic protective layer PVX is defined by etching the inorganic protective layer PVX exposed through the opening region 701'. The first connection metal CM1 and the conductive layer 230 below the inorganic protective layer PVX may be exposed through the hole PVX-h.

During an etching process of defining the hole PVX-h of the inorganic protective layer PVX, a remaining layer of the lower inorganic insulating layer corresponding to the bent area BA may be completely removed. In an exemplary embodiment, the buffer layer 110 and the second inorganic barrier layer 104 remaining in the bent area BA may be completely removed as illustrated in an enlarged view of FIG. 13EA, or the second inorganic barrier layer 104 remaining under the inorganic protective layer PVX in the bent area BA may be completely removed as illustrated in an enlarged view of FIG. 13EB, for example.

Figure 13F:
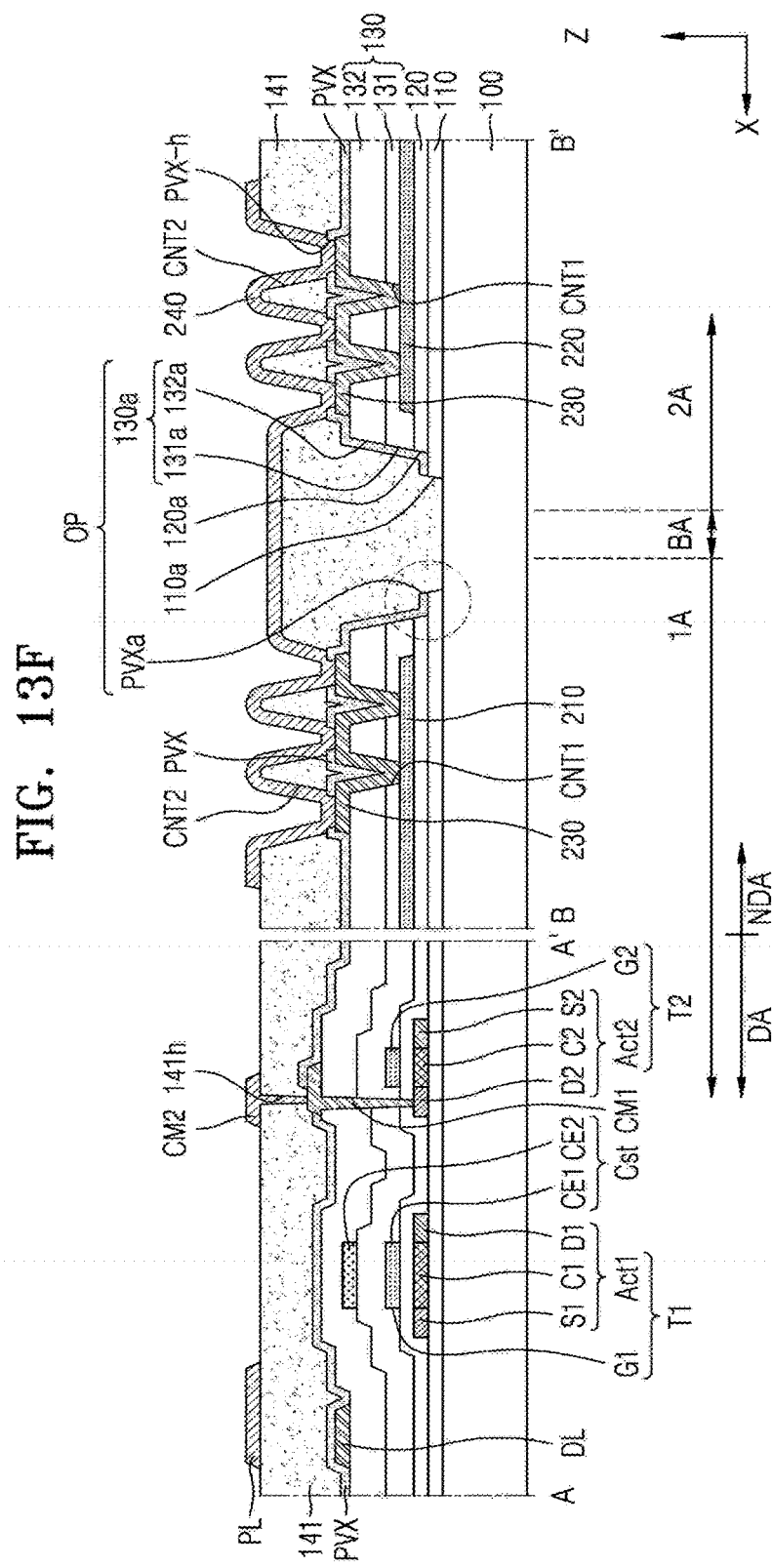
Figure 13F:
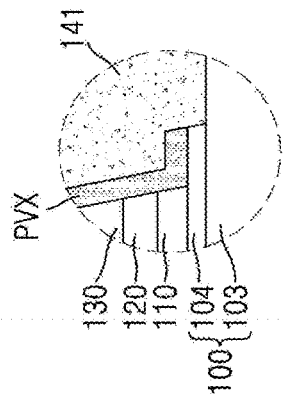
Figure 13F:
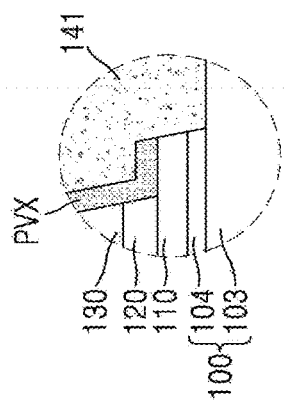

FIG. 13F is a cross-sectional view corresponding to seventh and eighth mask processes.

Referring to FIG. 13F, the first organic insulating layer 141 is provided by forming the organic material layer over the substrate 100 on which the sixth mask process has been performed, and patterning the organic material layer (the seventh mask process). The first organic insulating layer 141 is provided as one body such that the first organic insulating layer 141 is located in the display area DA and the non-display area NDA, and a hole 141h exposing the first connection metal CM1 and the second contact hole CNT2 exposing the conductive layer 230 are defined in the first organic insulating layer 141. In the region adjacent to the bent area BA, the first organic insulating layer 141 covers an end portion of the inorganic protective layer PVX. That is, in the region adjacent to the bent area BA, the end portion of the inorganic protective layer PVX may cover the inter-insulating layer 130, and simultaneously, may be covered by the first organic insulating layer 141.

The level L1 of the portion of the first organic insulating layer 141 corresponding to the bent area BA may be less than the level L2 of the other portions of the first organic insulating layer 141 as described above. The first organic insulating layer 141 may directly contact the second base layer 103 of the substrate 100 as illustrated in enlarged views of FIGS. 13FA and 13FB.

After that, the driving voltage line PL and the second connection metal CM2 in the display area DA, and the connection wiring 240 in the non-display area NDA are provided by forming and patterning the conductive material layer (the eighth mask process).

The second connection metal CM2 contacts the first connection metal CM1 through the hole 141h of the first organic insulating layer 141, and the connection wiring 240 contacts the conductive layer 230 through the second contact hole CNT2 of the first organic insulating layer 141.

Figure 13G:
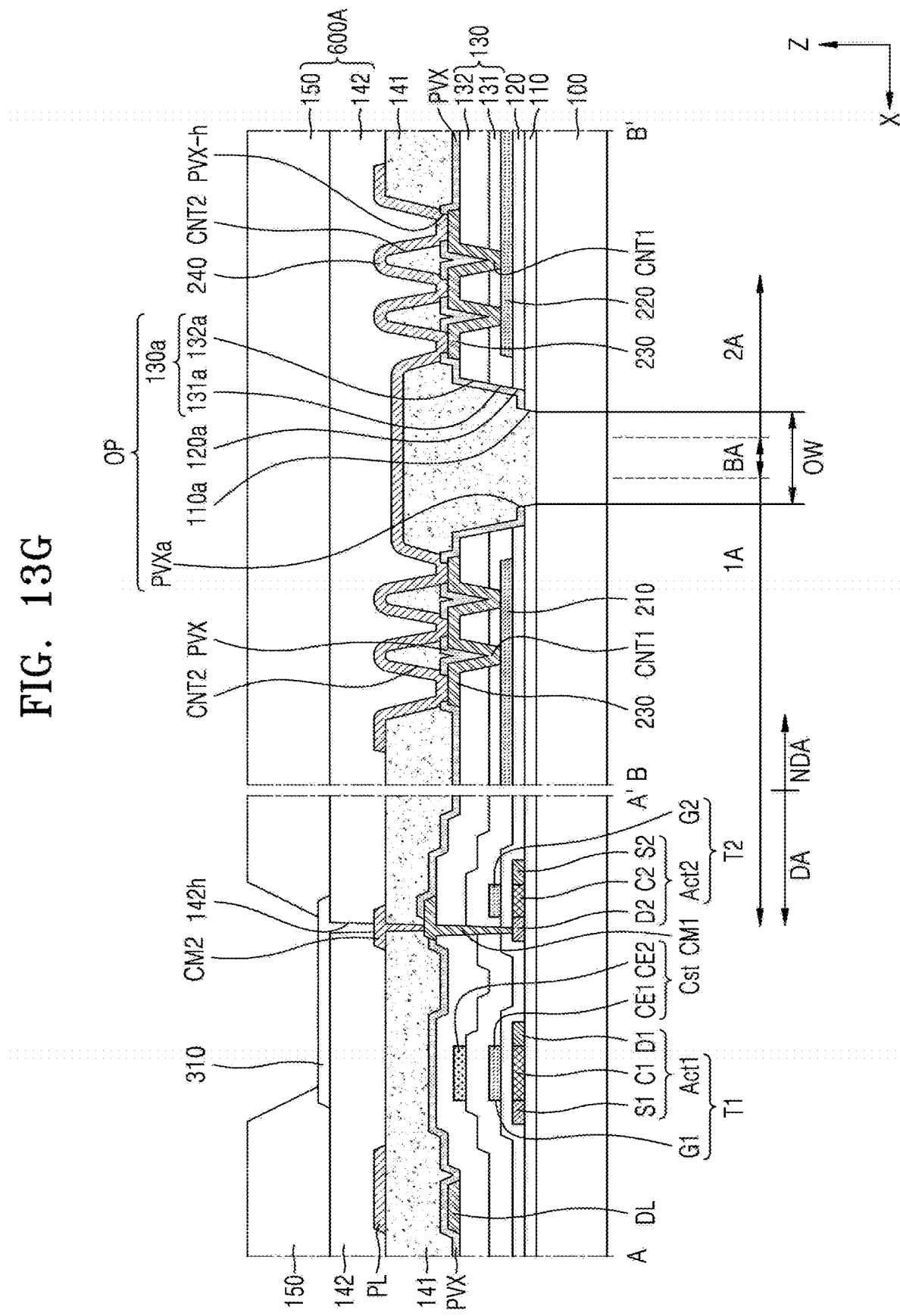

FIG. 13G is a cross-sectional view corresponding to ninth to eleventh mask processes.

Referring to FIG. 13G, the second organic insulating layer 142 is provided by forming the organic material layer over the substrate 100 on which the eighth mask process has been performed, and patterning the organic material layer (the ninth mask process). A hole 142h exposing the second connection metal CM2 is defined in the second organic insulating layer 142. The second organic insulating layer 142 may be provided in not only the display area DA but also the non-display area NDA.

After that, the pixel electrode 310 is provided by forming an electrode material layer on the second organic insulating layer 142 and the patterning the electrode material layer (the tenth mask process). Although the pixel electrode 310 may be provided by, for example, wet etching, the invention is not limited thereto.

Next, the pixel-defining layer 150 is provided by forming an insulating material layer on the pixel electrode 310 and patterning the insulating material layer (the eleventh mask process). An opening exposing the pixel electrode 310 is defined in the pixel-defining layer 150. The pixel-defining layer 150 may include an organic insulating material.

After that, descriptions of cross-sections corresponding to a process of forming an intermediate layer including an emission layer on the pixel electrode 310 exposed through the opening of the pixel-defining layer 150, and forming an opposite electrode on the intermediate layer, and a process of forming an encapsulation layer on the opposite electrode are the same as the descriptions made with reference to FIG. 3.

Like the mask processes described with reference to FIGS. 13D to 13E in the above, the lower inorganic insulating layer(s) corresponding to the bent area BA may be completely removed during the process of etching the inorganic protective layer PVX. Therefore, since a mask for removing a remaining layer of the lower inorganic insulating layer(s) corresponding to the bent area BA is not additionally desired, process efficiency may improve. Also, since a halftone mask is used, even when a thickness of the lower inorganic insulating layer(s) corresponding to the bent area BA is greater than a thickness of the inorganic protective layer PVX, the hole PVX-h of the inorganic protective layer PVX may be defined without damage of the first connection metal CM1, and simultaneously, portions of the lower inorganic insulating layer(s) corresponding to the bent area BA may be completely removed.

FIG. 13D describes the case where the width W1 (refer to FIG. 13D) of the second portion 702 of the photosensitive layer 700 corresponding to the bent area BA is less than the width W2 (refer to FIG. 13D) of the opening 130a of the inter-insulating layer 130 corresponding to the bent area BA. Therefore, although the inorganic protective layer PVX in the bent area BA is described to contribute to defining the width OW of the opening OP as illustrated in FIG. 13F, the invention is not limited thereto.

Figure 14:
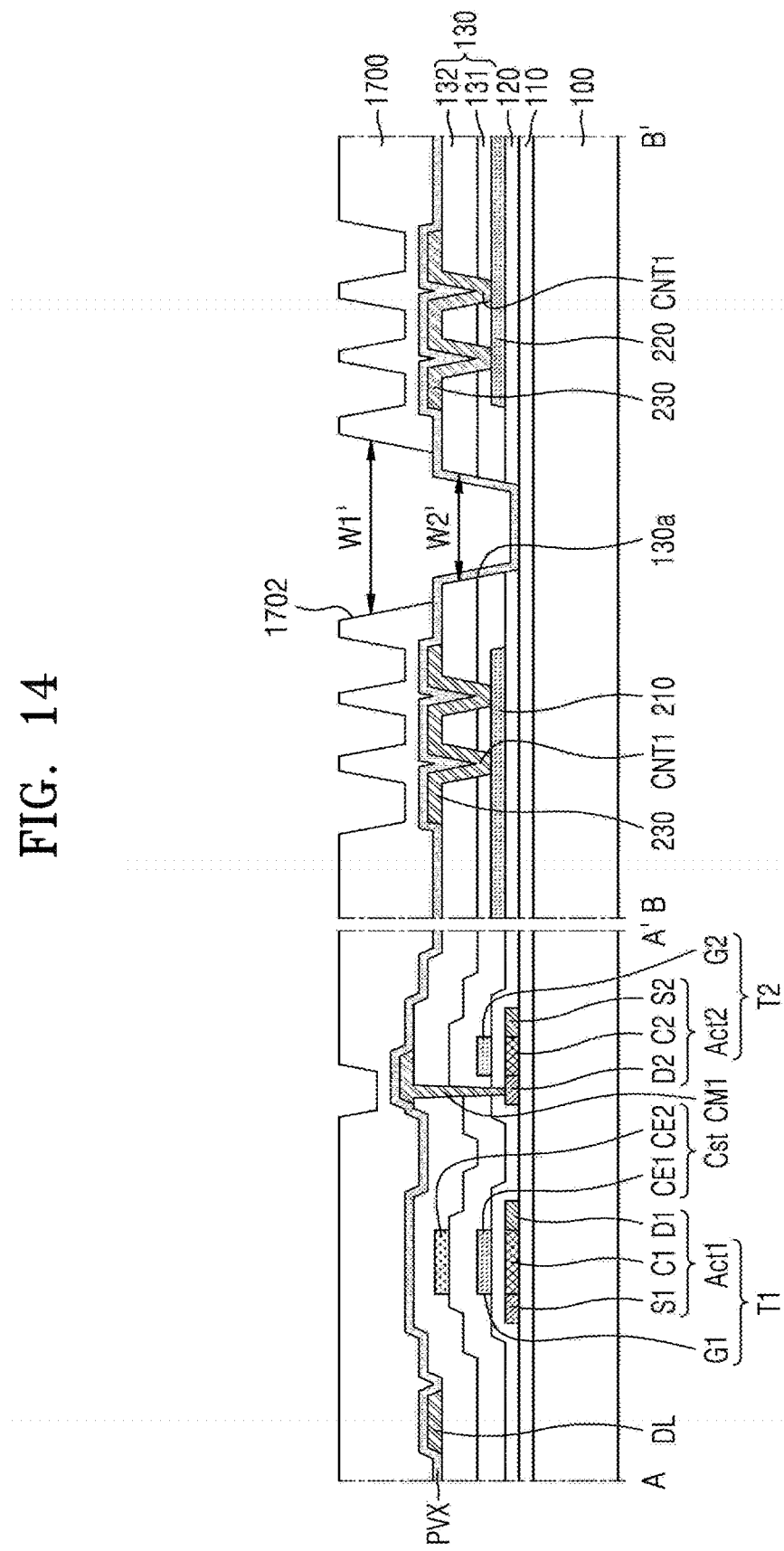
FIG. 14 is a cross-sectional view of a sixth mask process of a method of manufacturing a display device, according to another exemplary embodiment.

FIG. 14 is a cross-sectional view of the sixth mask process of a method of manufacturing a display device, according to another exemplary embodiment.

Referring to FIG. 14, the opening of a photosensitive layer 1700 corresponding to the bent area BA, that is, a width W1' of a second portion 1702 may be provided to be greater than a width W2' of the opening 130a of the inter-insulating layer 130 corresponding to the bent area BA.

In this case, an end portion of the patterned inorganic protective layer PVX may have substantially the same pattern as that of an end portion of the inter-insulating layer 130 as illustrated in FIG. 10. Since a specific method of the mask process illustrated in FIG. 14 and subsequent processes are the same as those described with reference to FIGS. 13F to 13G, and a structure corresponding thereto is the same as that described with reference to FIG. 10, descriptions thereof are omitted.

Although the invention has been described with reference to the exemplary embodiments illustrated in the drawings, this is merely provided as an example and it will be understood by those of ordinary skill in the art that various changes in form and details and equivalents thereof may be made therein without departing from the spirit and scope of the invention as defined by the following claims.

What is claimed is:

1. A display device comprising:
    a substrate including a first area, a second area, and a bent area between the first and second areas, wherein the substrate is bent;
    a transistor in the first area;
    a display element electrically coupled to the transistor;
    an inner wiring in the first area;
    an outer wiring in the second area;
    a connection wiring across the bent area of the substrate and electrically coupling the inner wiring to the outer wiring;
    an inorganic insulating layer on the substrate, the inorganic insulating layer having an opening in the bent area; and
    a first organic insulating layer on the inorganic insulating layer, a first portion of the first organic insulating layer being in the opening and at least partially filling the opening, and a second portion of the first organic insulating layer being between the transistor and the display element,
    wherein a height of the connection wiring overlapping the inner or outer wirings is greater than a height of the connection wiring overlapping the bending area relative to the substrate.

2. The display device of claim 1, wherein the first portion of the first organic insulating layer is below the connection wiring in the bent area and is an organic material that is closest to the substrate in the bent area.

3. The display device of claim 1, wherein a first height from the substrate to an uppermost surface defining the first portion of the first organic insulating layer is less than a second height from the substrate to an uppermost surface defining the second portion of the first organic insulating layer.

4. The display device of claim 1, further comprising a first conductor layer on the inorganic insulating layer,
    wherein the first conductor layer is electrically connected to the inner wiring via a first contact hole of the inorganic insulating layer, and a first portion of the connection wiring is electrically connected to the first conductor layer via a second contact hole of the first organic insulating layer.

5. The display device of claim 4, further comprising an inorganic protective layer on the first conductor layer,
    wherein the inorganic protective layer includes a hole corresponding to the second contact hole.

6. The display device of claim 5, wherein the inorganic protective layer includes an opening in the bent area.

7. The display device of claim 6, wherein a width of the opening of the inorganic protective layer is different from that of the opening of the inorganic insulating layer.

8. The display device of claim 7, wherein a width of the opening of the inorganic protective layer is less than that of the opening of the inorganic insulating layer, and
    wherein a side surface of the inorganic insulating layer, which defines the opening of the inorganic insulating layer, is in direct contact with the inorganic protective layer.

9. The display device of claim 4, further comprising a second conductor layer on the inorganic insulating layer,
    wherein the second conductor layer is electrically connected to the outer wiring via a third contact hole of the inorganic insulating layer, wherein a second portion of the connection wiring is electrically connected to the second conductor layer via a fourth contact hole of the first organic insulating layer.

10. The display device of claim 9, wherein the substrate comprises:
   a base layer; and
   an inorganic barrier layer on the base layer.

11. The display device of claim 10, wherein the inorganic barrier layer includes an opening in the bent area.

12. The display device of claim 1, further comprising:
   a buffer layer on the substrate, a first portion of the buffer layer being between the substrate and the transistor.

13. The display device of claim 12, wherein a second portion of the buffer layer includes an opening in the bent area.

14. The display device of claim 1, further comprising a second organic insulating layer over the connection wiring.

15. A display device comprising:
   a substrate including a first area, a second area, and a bent area between the first and second areas, wherein the substrate is bent;
   a transistor in the first area;
   a display element electrically coupled to the transistor;
   an inner wiring in the first area;
   an outer wiring in the second area;
   a connection wiring across the bent area of the substrate and electrically coupling the inner wiring to the outer wiring;
   an inorganic insulating layer on the substrate, the inorganic insulating layer having an opening in the bent area; and
   a first organic insulating layer on the inorganic insulating layer, a first portion of the first organic insulating layer being in the opening and at least partially filling the opening, and a second portion of the first organic insulating layer being between the transistor and the display element,
   wherein a first height from the substrate to an uppermost surface of the first portion of the first organic insulating layer at a center of the bent area is less than a second height from the substrate to an uppermost surface of the second portion of the first organic insulating layer.

* * * * *